(12) United States Patent
Masuoka et al.

(10) Patent No.: US 8,921,905 B2
(45) Date of Patent: Dec. 30, 2014

(54) SOLID-STATE IMAGING DEVICE

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/053,077

(22) Filed: Oct. 14, 2013

(65) Prior Publication Data

US 2014/0103408 A1    Apr. 17, 2014

Related U.S. Application Data

(60) Provisional application No. 61/714,388, filed on Oct. 16, 2012.

(51) Int. Cl.
*H01L 31/0232* (2014.01)

(52) U.S. Cl.
CPC ................... *H01L 31/0232* (2013.01)
USPC .................... 257/294; 257/E27.135

(58) Field of Classification Search
USPC .................... 257/294, 434, E27.135
See application file for complete search history.

(56) References Cited

U.S. PATENT DOCUMENTS 7,737,519 B2 * 6/2010 Tamura et al. ............... 257/292
8,541,858 B2 * 9/2013 Kokubun .................... 257/294

| | | |
|---|---|---|
| 2005/0082627 A1 | 4/2005 | Jang |
| 2010/0200731 A1 | 8/2010 | Masuoka et al. |
| 2011/0215381 A1 | 9/2011 | Masuoka et al. |
| 2011/0220969 A1 | 9/2011 | Masuoka et al. |
| 2012/0025281 A1 | 2/2012 | Masuoka et al. |
| 2012/0104478 A1 | 5/2012 | Masuoka et al. |

FOREIGN PATENT DOCUMENTS

| | | |
|---|---|---|
| JP | 2005-175430 | 6/2005 |
| WO | WO2009/034731 | 3/2009 |
| WO | WO2012/056782 | 5/2012 |

OTHER PUBLICATIONS

Egawa, Y. et al., "A White-RGB CFA-Patterned CMOS Image Sensor with Wide Dynamic Range", *ISSCC 2008, Digest of Technical Papers*, 2008, pp. 52-53, 595.

Honda, H. et al. "A Color CMOS Imager with 4×4 White-RGB Color Filter Array for Increased Low-Illumination Signal-to-Noise Ratio", *III Transaction on Electron Devices*, vol. 56, No. 11, 2009, pp. 2398-2402.

International Search Report for PCT/JP2012/076703 dated Dec. 11, 2012, 12 pages.

* cited by examiner

*Primary Examiner* — Chandra Chaudhari
(74) *Attorney, Agent, or Firm* — Brinks Gilson & Lione

(57) ABSTRACT

In a solid-state imaging device, N regions serving as photoelectric conversion diodes are formed on outer peripheries of P regions in upper portions of island-shaped semiconductors formed on a substrate, and $P^+$ regions connected to a pixel selection line conductive layer are formed on top layer portions of upper ends of the island-shaped semiconductors so as to adjoin the N regions and the P regions. In the $P^+$ regions, a first $P^+$ region has a thickness less than a second $P^+$ region, and the second $P^+$ region has a thickness less than a third $P^+$ region.

8 Claims, 20 Drawing Sheets

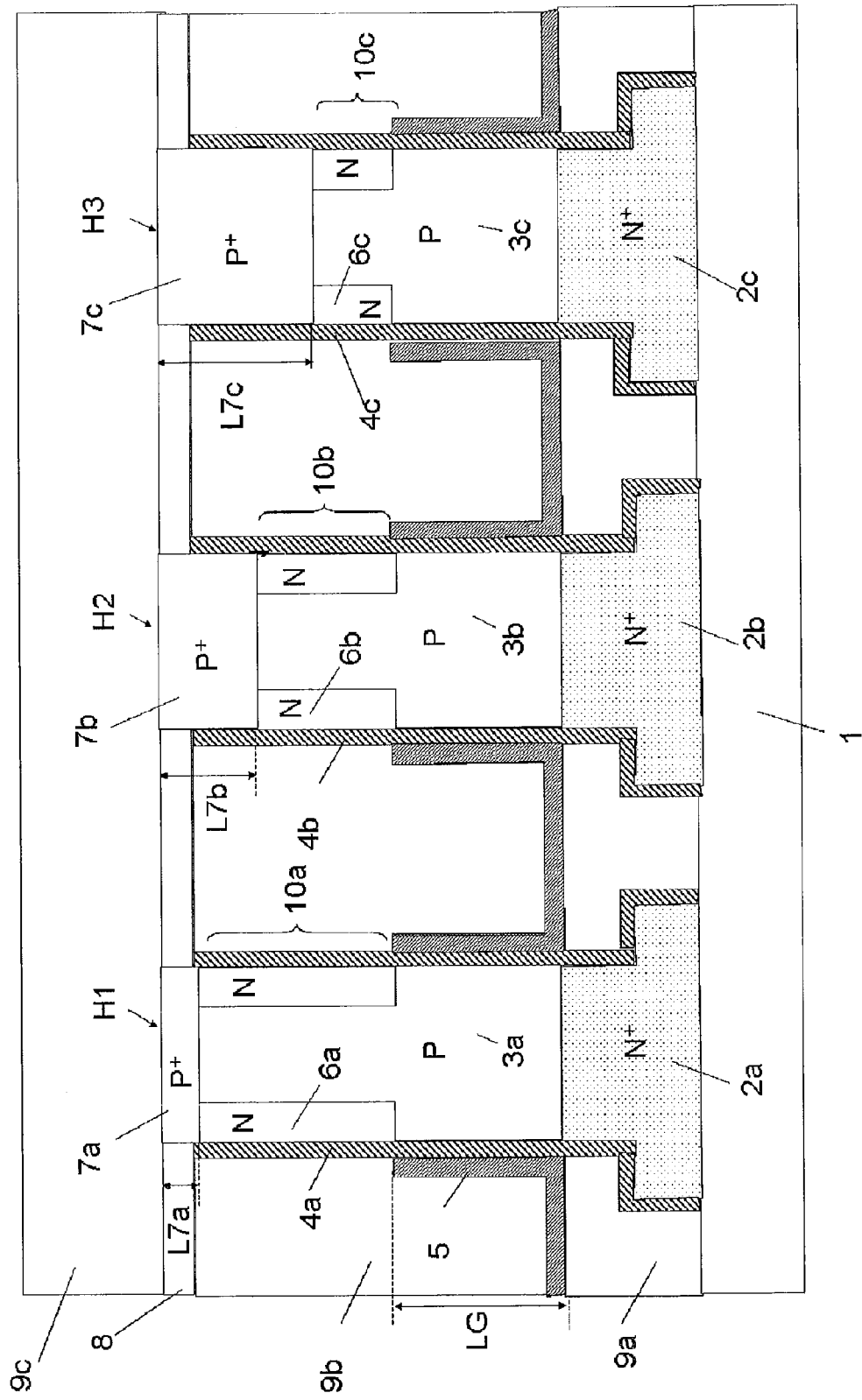

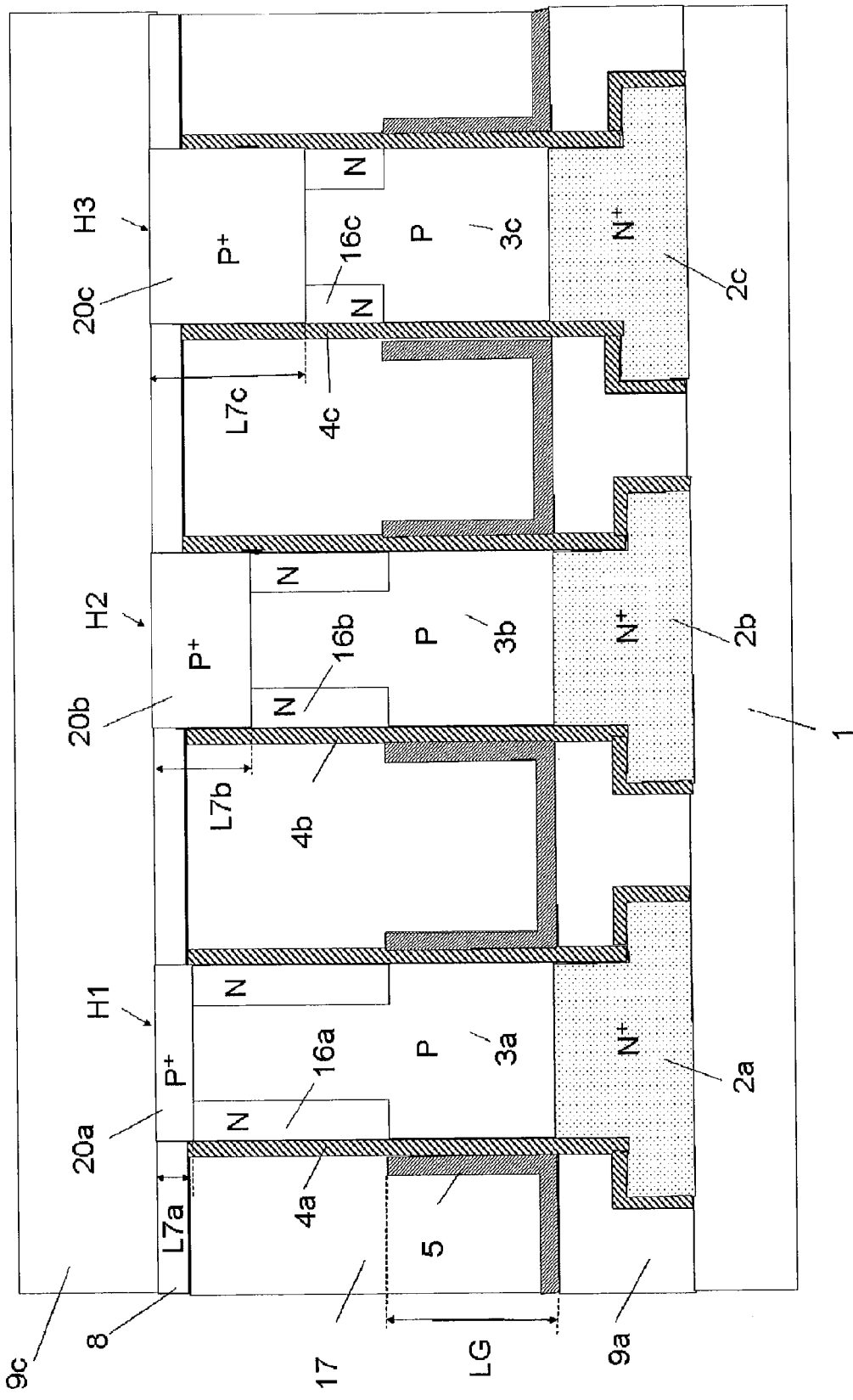

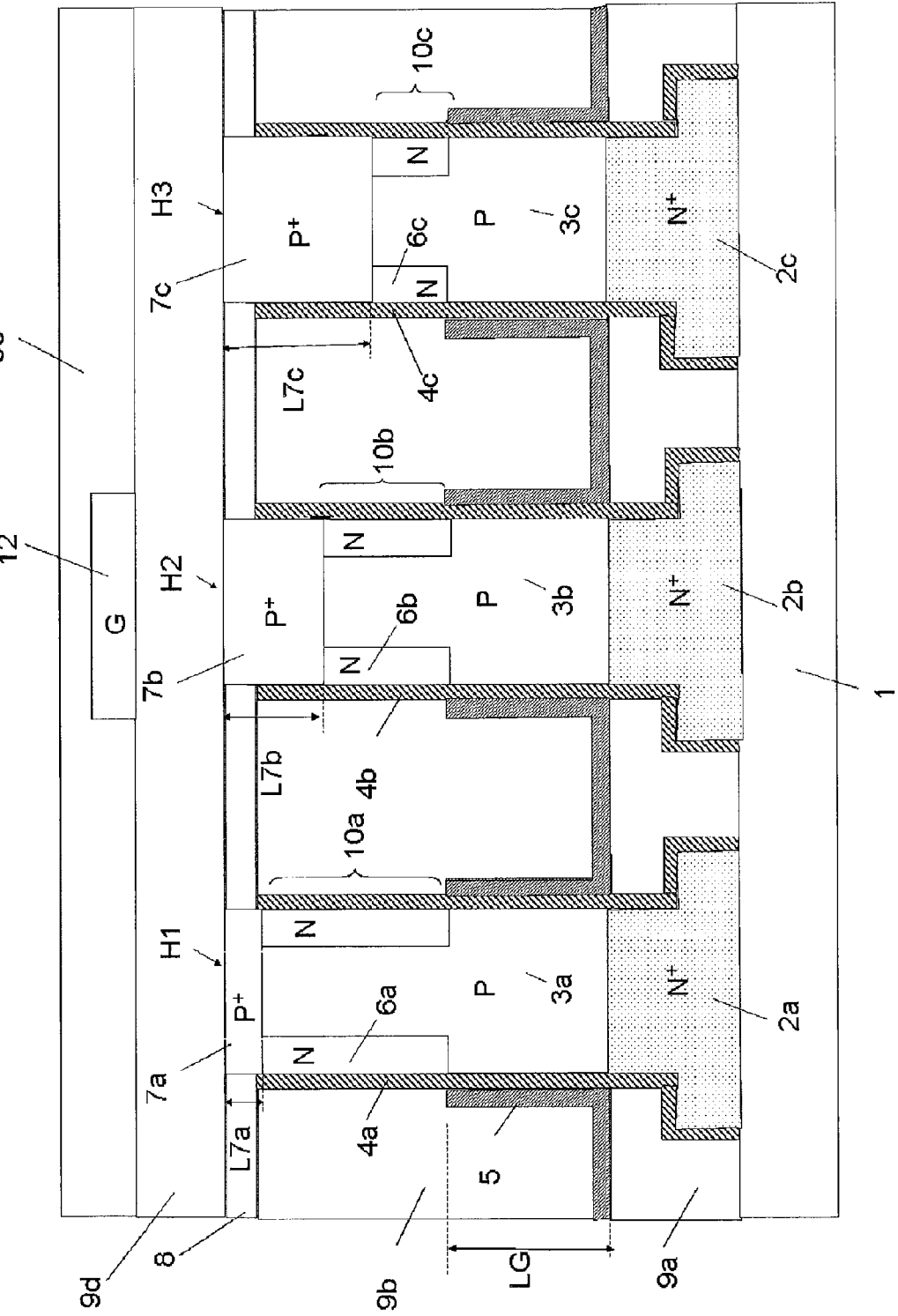

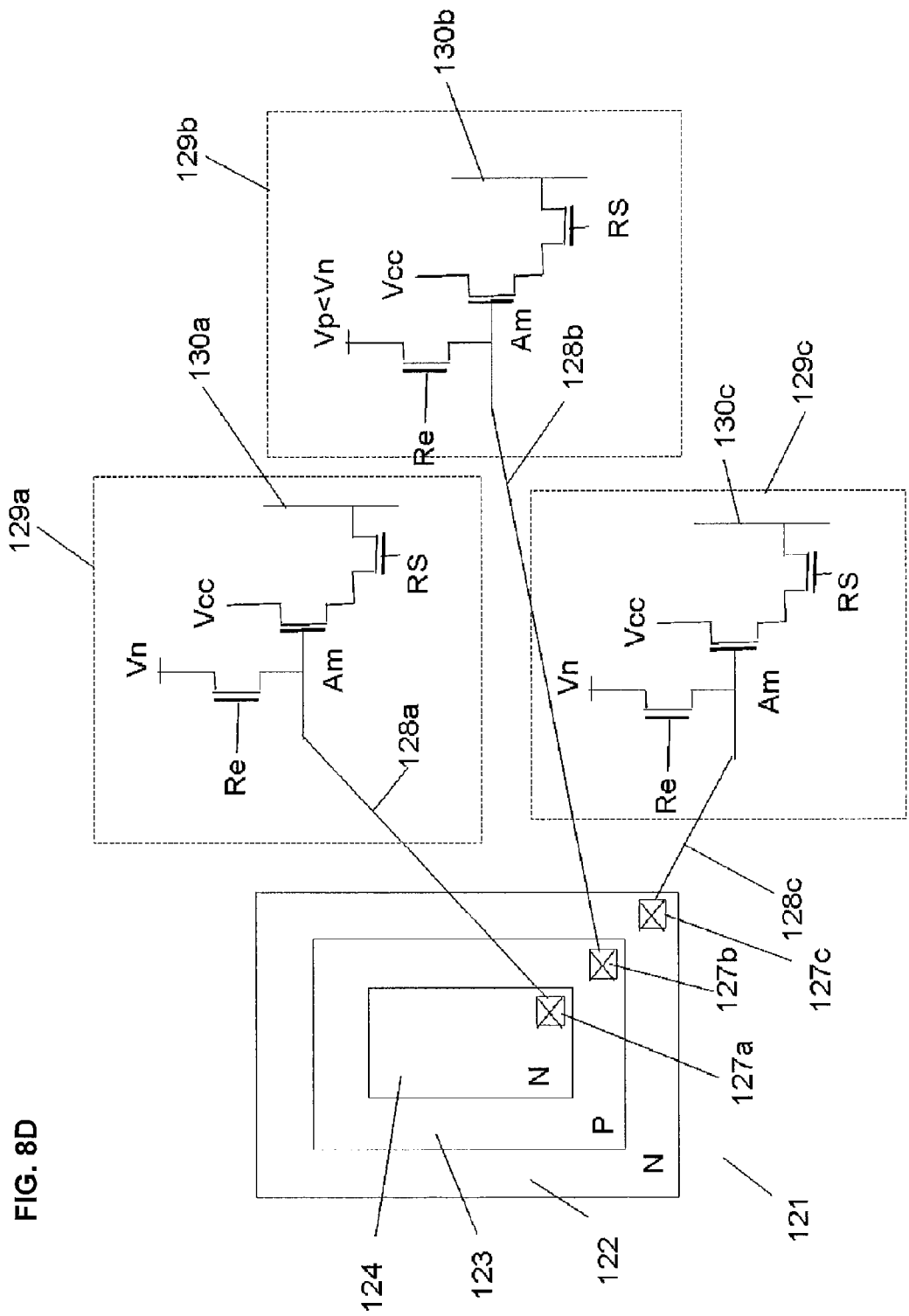

SOLID-STATE IMAGING DEVICE

RELATED APPLICATIONS

Pursuant to 35 U.S.C. §119(e), this application claims the benefit of the filing date of Provisional U.S. Patent Application Ser. No. 61/714,388 filed on Oct. 16, 2012. The entire content of this application is hereby incorporated by reference.

BACKGROUND OF THE INVENTION

1. Field of the Invention

The present invention relates to solid-state imaging devices, and more specifically to a solid-state imaging device for color imaging in which a pixel is formed using an island-shaped semiconductor (a pillar-shaped semiconductor), with a high pixel density, a high sensitivity, and a wide dynamic range being achieved.

2. Description of the Related Art

Solid-state imaging devices for color imaging, such as CCD and CMOS imaging devices, are generally used in video cameras, still cameras, and so forth. In these uses, solid-state imaging devices for color imaging are required to have improved performance such as a high pixel density, a high sensitivity, and a wide dynamic range.

FIG. 6 illustrates a cross-sectional structural diagram of a CMOS color solid-state imaging device of the related art (see, for example, U.S. Patent Application Publication No. 2005/0082627).

Isolation silicon oxide layers (hereinafter, represented by $SiO_2$ layers) 101a to 101d are formed on a surface of a P-region (hereinafter, a P-type semiconductor region including acceptor impurities is represented by a "P region") silicon (hereinafter represented by "Si") substrate 100 using, for example, the LOCOS (Local Oxidation of Silicon) method. N regions (hereinafter, an N-type semiconductor region including donor impurities is represented by an "N region") 102a to 102c are formed between the isolation $SiO_2$ layers 101a to 101d.

In FIG. 6, the P-region substrate 100 and the N regions 102a to 102c form photodiodes based on P-N junctions. Incident light (electromagnetic energy waves) incident on the upper surfaces of the N regions 102a to 102c undergoes photoelectric conversion in the N regions 102a to 102c and the P-region substrate 100 located below the N regions 102a to 102c, and signal charges (in this case, free electrons) are generated. The generated signal charges are accumulated in the photodiodes, and are extracted to an external output circuit as the signal output current in a certain period.

An interlayer $SiO_2$ layer 103 is formed on the isolation $SiO_2$ layers 101a to 101d and the N regions 102a to 102c. Metal wirings 104a to 104d are formed on the interlayer $SiO_2$ layer 103. Further, a protective insulating layer 105 composed of, for example, a $SiO_2$ or organic material layer is formed on the interlayer $SiO_2$ layer 103 and the metal wirings 104a to 104d.

In FIG. 6, the upper surface of the protective insulating layer 105 is planarized. A color filter 106R for red (R), a color filter 106G for green (G), and a color filter 106B for blue (B) are arranged on or above the protective insulating layer 105 so as to surround the N regions 102a to 102c, which form photodiodes, when viewed in a direction perpendicular to the upper surface. Isolation insulating layers 107a to 107c are formed between the color filter 106R for red (R), the color filter 106G for green (G), and the color filter 106B for blue (B).

The color filter 106R for red (R) is a layer that transmits mainly red wavelength light in incident light incident on the upper surfaces of the N regions 102a to 102c. The color filter 106G for green (G) is a layer that transmits mainly green wavelength light in the incident light. The color filter 106B for blue (B) is a layer that transmits mainly blue wavelength light in the incident light.

The color filter 106R for red (R) (hereinafter, the "color filter 106R" for short), the color filter 106G for green (G) (hereinafter, the "color filter 106G" for short), and the color filter 106B for blue (B) (hereinafter, the "color filter 106B" for short) are formed by a photoresist containing pigments or dyes. The color filter 106G for green (G) is formed using photolithography technology, and is coated with the protective insulating layer 105 and is also coated with the isolation insulating layer 107a from above the color filter 106G. The color filter 106R and the color filter 106B are formed on or over the isolation insulating layer 107a using photolithography technology. The isolation insulating layer 107c also functions as a protection layer of the color filters 106R, 106G, and 106B.

The isolation $SiO_2$ layers 101a to 101d, the N regions 102a to 102c, and the metal wirings 104a to 104d formed on or over the P-region substrate 100 illustrated in FIG. 6 are formed using advanced CMOS micromachining technology, which is a micromachining technology used for microprocessors, memories, and so forth. Although not illustrated in FIG. 6, CMOS transistors for forming a driver circuit, a signal processing circuit, and so forth are formed on or over the P-region substrate 100 using the advanced CMOS micromachining technology in a manner similar to that for the isolation $SiO_2$ layers 101a to 101d, the N regions 102a to 102c, and the metal wirings 104a to 104d.

The advanced CMOS micromachining technology is not available for the formation of the color filter 106R, the color filter 106G, and the color filter 106B. The color filter 106R, the color filter 106G, and the color filter 106B are formed using photolithography technology that utilizes a different photoresist material.

The micromachinable dimensions (minimum machining dimensions) of the color filter 106R, the color filter 106G, and the color filter 106B which are realized by the photolithography technology are greater (larger) than the micromachinable dimensions which are realized by the advanced CMOS micromachining technology described above. In this manner, the inability to apply micromachining technology to the color filters 106R, 106G, and 106B hinders a further increase in the pixel density of CMOS solid-state imaging devices.

In addition, the process and apparatus for forming the color filters 106R, 106G, and 106B are different from the process and apparatus used in advanced CMOS micromachining technology described above, which may cause an increase in cost. This imposes a problem of reduction in the cost of solid-state imaging devices.

Additionally, the material of the color filters 106R, 106G, and 106B causes light absorption, which thus prevents the color filter 106B from achieving a light transmittance of 100% in the red (R) wavelength region. Similarly to this, the color filter 106G and the color filter 106B are also prevented from achieving a light transmittance of 100% in the green (G) wavelength region and the blue (B) wavelength region, respectively. In this manner, light absorption which prevents improvements in the light transmittance of the color filters 106R, 106G, and 106B hinders the sensitivity of CMOS color solid-state imaging devices from increasing.

Hereinafter, another solid-state imaging device for color imaging of the related art will be described with reference to FIGS. 7A to 7C.

FIG. 7A illustrates a cross-sectional structural diagram of a solid-state imaging device in which one island-shaped semiconductor constitutes one pixel (see, for example, U.S. Patent Application Publication No. 2010/0200731).

Referring to FIG. 7A, a signal line $N^+$ region 112 (hereinafter, a semiconductor region including a large number of donor impurities is referred to as an "$N^+$ region") is formed on a substrate 111. An island-shaped semiconductor 110 is formed on the signal line $N^+$ region 112. In the island-shaped semiconductor 110, an insulating layer 114 is formed on an outer periphery of a P region 113 adjoining the signal line $N^+$ region 112, and a conductive layer 115 is further formed with the insulating layer 114 interposed between the conductive layer 115 and the P region 113. An N region 116 is formed on the outer periphery of the P region 113 above the conductive layer 115. A $P^+$ region (hereinafter, a semiconductor region including a large number of acceptor impurities is referred to as a "$P^+$ region") 117 is formed on the N region 116 and the P region 113. The $P^+$ region 117 is connected to a pixel selection line conductive layer 118. The insulating layer 114 described above is continuously formed in such a manner as to surround an outer periphery of the island-shaped semiconductor 110. Similarly to the insulating layer 114, the conductive layer 115 is also continuously formed in such a manner as to surround the outer periphery of the island-shaped semiconductor 110.

In this solid-state imaging device, the P region 113 and the N region 116 in the island-shaped semiconductor 110 form a photodiode region 119. When light is incident on the $P^+$ region 117 side on a top layer of an upper end of the island-shaped semiconductor 110, signal charges (here, free electrons) are generated in a photoelectric conversion region in the photodiode region 119. The generated signal charges are accumulated mainly in the N region 116 of the photodiode region 119.

The island-shaped semiconductor 110 further has a junction field-effect transistor having a gate which is defined by the N region 116, a source which is defined by the $P^+$ region 117, and a drain which is defined by the P region 113 in the vicinity of the signal line $N^+$ region 112.

In this solid-state imaging device, the drain-source current (output signal) of the junction field-effect transistor changes in accordance with the quantity of signal charges accumulated in the N region 116, and is extracted from the signal line $N^+$ region 112 as the signal output.

The island-shaped semiconductor 110 further has a MOS transistor having a source which is defined by the N region 116 of the photodiode region 119, a gate which is defined by the conductive layer 115, a drain which is defined by the signal line $N^+$ region 112, and a channel which is defined by the P region 113 between the N region 116 and the signal line $N^+$ region 112.

In this solid-state imaging device, the signal charges accumulated in the N region 116 are discharged to the signal line $N^+$ region 112 by the application of the ON voltage (high-level voltage) to the conductive layer 115 that is the gate of the MOS transistor.

Herein, the term "high-level voltage" refers to a positive voltage having a high level in a case where the signal charges are free electrons, and the term "low-level voltage" refers to a voltage whose absolute value is lower than the "high-level voltage". Accordingly, if the signal charges are positive holes, the "high-level voltage" implies a negative voltage having a low level, and the "low-level voltage" refers to a voltage that is closer to 0 V than the "high-level voltage".

The imaging operation of this solid-state imaging device includes the operations (1) to (3) below while the ground voltage (=0 V) is applied to the signal line $N^+$ region 112, the conductive layer 115, and the $P^+$ region 117:

(1) A signal charge accumulating operation for accumulating in the N region 116 the signal charges generated in the photoelectric conversion region (the photodiode region 119) by the incidence of light on the top surface of the upper end of the island-shaped semiconductor 110, (2) A signal charge read operation for reading as the signal current the source-drain current of the junction field-effect transistor that has been modulated by the potential of the N region 116 which has changed in accordance with the quantity of accumulated signal charges while the ground voltage is applied to the signal line $N^+$ region 112 and the conductive layer 115 and a positive voltage is applied to the $P^+$ region 117, and (3) A reset operation for discharging the signal charges accumulated in the N region 116 to the signal line $N^+$ region 112 while the ground voltage is applied to the $P^+$ region 117 and a positive voltage is applied to the conductive layer 115 and the signal line $N^+$ region 112 after the signal charge read operation.

FIG. 7B illustrates a plan view of a solid-state imaging device of the related art in which island-shaped semiconductors P11 to P33 (each of which corresponds to the island-shaped semiconductor 110 in FIG. 7A) constituting pixels are arranged in a two-dimensional matrix. The island-shaped semiconductors P11 to P33 constituting pixels are formed on signal line $N^+$ regions 112a, 112b, and 112c (each of which corresponds to the signal line $N^+$ region 112 in FIG. 7A).

In the island-shaped semiconductors P11 to P33, pixel selection line conductive layers 118a, 118b, and 118c (each of which corresponds to the pixel selection line conductive layer 118 in FIG. 7A) are each continuously formed in each row extending in the horizontal direction. Similarly to this, in the island-shaped semiconductors P11 to P33 constituting pixels, conductive layers 115a, 115b, and 115c (each of which corresponds to the conductive layer 115 in FIG. 7A) are each continuously formed in each row extending in the horizontal direction.

Color filters B1, B2, and B3 for blue (B), color filters R1, R2, and R3 for red (R), and color filters G1, G2, and G3 for green (G) are formed on the island-shaped semiconductors P11 to P33.

With the configuration described above, the blue (B) signal current is obtained from the pixels of the island-shaped semiconductors P11, P21, and P31, the green (G) signal current is obtained from the pixels of the island-shaped semiconductors P12, P22, and P32, and the red (R) signal current is obtained from the pixels of the island-shaped semiconductors P13, P23, and P33.

In the configuration illustrated in FIG. 7B, spaces are required between the island-shaped semiconductors P11 to P33 in order to ensure a mask alignment margin in manufacturing, which is necessary to form a mask so as to surround the color filters B1, B2, B3, R1, R2, R3, G1, G2, and G3 and the island-shaped semiconductors P11 to P33. These spaces limit an increase in the density of the pixels. In this solid-state imaging device of the related art, furthermore, as in the solid-state imaging device illustrated in FIG. 6, light absorption in the color filters B1, B2, B3, R1, R2, R3, G1, G2, and G3 prevents an increase in sensitivity.

FIG. 7C illustrates a cross-sectional structural diagram taken along the line C-C' in FIG. 7B.

Referring to FIG. 7C, the signal line $N^+$ regions 112a, 112b, and 112c are formed on a substrate 111a, and the island-shaped semiconductors P11, P12, and P13 are formed on the signal line N+ regions 112a, 112b, and 112c. Insulating layers 120a are formed on the substrate 111a between the island-shaped semiconductors P11, P12, and P13, and the conductive layer 115a is formed on outer peripheries of P regions 113a, 113b, and 113c adjoining the signal line N+ regions 112a, 112b, and 112c of the island-shaped semiconductor P11, P12, and P13 with insulating layers 114a, 114b, and 114c disposed between the conductive layer 115a and the P regions 113a, 113b, and 113c. The conductive layer 115a is formed so as to connect the island-shaped semiconductors P11, P12, and P13 to one another, and N regions 116a, 116b, and 116c of photodiodes are formed on the outer peripheries of the island-shaped semiconductor P11, P12, and P13 above upper ends of the conductive layer 115a, which is located inside the island-shaped semiconductor P11, P12, and P13. Insulating layers 120b are formed on or over the conductive layer 115a and the insulating layers 120a between the island-shaped semiconductors P11, P12, and P13, and P+ regions 117a, 117b, and 117c are formed on top layers of upper ends of the island-shaped semiconductors P11, P12, and P13. The pixel selection line conductive layer 118a is formed on the insulating layers 120b so as to adjoin the P+ regions 117a, 117b, and 117c. An insulating layer 120c is formed on or over the insulating layers 120b, the pixel selection line conductive layer 118a, and the P+ regions 117a, 117b, and 117c. The top surface of the insulating layer 120c is planarized, and the color filter B1 for blue (B), the color filter G1 for green (G), and the color filter R1 for red (R) are formed on the insulating layer 120c. An overcoat insulating layer 120d is formed on the color filters B1, G1, and R1 and the insulating layer 120c. The color filters B1, G1, and R1 are formed using a manufacturing method similar to that for the solid-state imaging device illustrated in FIG. 6, unlike the micromachining technology used for the pixel structure of the island-shaped semiconductors P11, P12, and P13. Thus, there are problems in increasing the density of pixels and reducing cost.

Hereinafter, another solid-state imaging device of the related art which is capable of color imaging without using color filters will be described with reference to FIGS. 8A to 8D.

FIG. 8A illustrates a cross-sectional structural diagram of this solid-state imaging device (see, for example, U.S. Patent Application Publication No. 2012/104478).

Referring to FIG. 8A, an N region (N well) 122 is formed in a P-region substrate 121, and a P region (P well) 123 is formed in the N region 122. Here, an N region 124 is formed in the P region 123. A diode formed of the P-region substrate 121 and the N region 122, a diode formed of the N region 122 and the P region 123, and a diode formed of the P region 123 and the N region 124 are reversely biased.

Here, the depth of the N region 124 from the top surface of the P-region substrate 121 is desirably approximately 0.2 μm, the depth of the P region 123 from the top surface of the P-region substrate 121 is desirably approximately 0.6 jam, and the depth of the N region 122 from the top surface of the P-region substrate 121 is desirably approximately 2 μm.

Of the incident light incident on the top surface of the P-region substrate 121, mainly blue (B) wavelength light undergoes photoelectric conversion in a diode region 126a (in FIG. 8A, a region surrounded by a dotted line) that is formed of the P region 123 and the N region 124, and generated signal charges are accumulated in the diode region 126a. Mainly green (G) wavelength light undergoes photoelectric conversion in a diode region 126b (in FIG. 8A, a region surrounded by a dotted line) that is formed of the P region 123 and the N region 122, and generated signal charges are accumulated in the diode region 126b. Further, mainly red (R) wavelength light undergoes photoelectric conversion in a diode region 126c (in FIG. 8A, a region surrounded by a dotted line) that is formed of the P-region substrate 121 and the N region 122, and generated signal charges are accumulated in the diode region 126b.

Then, the signal charges accumulated in the diode region 126a are read as a blue (B) signal using an ammeter 125a, and the signal charges accumulated in the diode region 126a are read as a green (G) signal using an ammeter 125b, and the signal charges accumulated in the diode region 126c are read as a red (R) signal using an ammeter 125c.

The solid-state imaging device illustrated in FIG. 8A is capable of color imaging without using color filters because it utilizes the light absorption characteristics of the semiconductors (made of silicon (Si) in this case) illustrated in FIG. 8B.

As illustrated in FIG. 8B, a large proportion of the blue (B) wavelength light ($\lambda$=400 nm) is absorbed in the vicinity of the Si (silicon) surface, and light having a larger wavelength ($\lambda$) such as green (G) wavelength light ($\lambda$=550 nm) and red (R) wavelength light ($\lambda$=700 nm) penetrates further inside the Si (silicon), and is absorbed. Accordingly, mainly a blue (B) signal is obtained in the diode region 126a, mainly a green (G) signal is obtained in the diode region 126b, and mainly a red (R) signal is obtained in the diode region 126c.

FIG. 8C illustrates the light wavelength ($\lambda$) dependence of the outputs obtained from the ammeters 125a, 125b, and 125c.

As illustrated in FIG. 8C, the blue (B) signal output VB obtained from the ammeter 125a mainly has the blue (B) wavelength light output component, the green (G) signal output VG obtained from the ammeter 125b mainly has the green (G) wavelength light output component, and the red (R) signal output VR obtained from the ammeter 125c mainly has the red (R) wavelength light output component. A signal computation process such as white balance is performed on the signal outputs VB, VG, and VR to obtain desired RGB signals.

FIG. 8D illustrates a plan view of the cross-sectional structure illustrated in FIG. 8A, when viewed from above the P-region substrate 121, and also illustrates output circuits.

As illustrated in FIG. 8D, the N region (N well) 122 is formed in the P-region substrate 121, and the P region (P well) 123 is formed in the N region 122. The N region 124 is formed in the P region 123. A contact hole 127a, a contact hole 127b, and a contact hole 127c are formed in the N region 124, the P region 123, and the N region 122, which are on the same surface as the top surface of the P-region substrate 121, respectively.

The N region 124 and an output circuit 129a (in FIG. 8D, a region surrounded by a dotted line) are connected via the contact hole 127a and a lead 128a connecting with the contact hole 127a. The P region 123 and an output circuit 129b (in FIG. 8D, a region surrounded by a dotted line) are connected via the contact hole 127b and a lead 128b connecting with the contact hole 127b. The N region 122 and an output circuit 129c (in FIG. 8D, a region surrounded by a dotted line) are connected via the contact hole 127c and a lead 128c connecting with the contact hole 127c.

Each of the output circuits 129a, 129b, and 129c is constituted by an amplifier MOS transistor Am configured to sense the voltage of the corresponding one of the N region 124, the P region 123, and the N region 122, a row selection MOS transistor RS, and a reset MOS transistor Re for discharging the signal charges accumulated in the corresponding one of the diode regions 126a, 126b, and 126c. A blue (B) signal is read from a signal line 130a for blue (B), a green (G) signal is read from a signal line 130b for green (G), and a red (R) signal is read from a signal line 130c for red (R). The output circuits 129a, 129b, and 129c are formed on a surface of the P-region substrate 121 outside the N region 122.

The solid-state imaging device illustrated in FIGS. 8A and 8D has features in that, compared to the solid-state imaging device illustrated in FIG. 6, the solid-state imaging device is capable of color imaging without using color filters and the diode regions 126a, 126b, and 126c where photoelectric conversion is performed on RGB wavelength light overlap one another in the depth direction.

In this solid-state imaging device, however, since the N region 124 that receives blue (B) wavelength light, which is required to have the largest light-receiving area, is formed inside the P region 123 and the N region 122, a large pixel size is used to obtain desired blue (B) wavelength light sensitivity. There is another problem in that the solid-state imaging device is not capable of obtaining signals of white (W) wavelength light including all of blue (B) wavelength light, green (G) wavelength light, and red (R) wavelength light.

In the solid-state imaging device illustrated in FIG. 6, a new pixel having none of the color filters 106B, 106G, and 106R is formed separately from the pixels having the color filters 106B, 106G, and 106R, and a white (W) wavelength light signal is obtained from the pixel, thereby achieving a high sensitivity or a wide dynamic range (see, for example, H. Honda, Y. Iida, Y. Egawa, H. Seki; "A Color CMOS Imager with 4×4 White-RGB Color Filter Array for Increased Low-Illumination Signal-to-Noise Ratio", III Transaction on Electron Devices, Vol. 56, No. 11, pp. 2398-2402 (2009); and Y. Egawa, N. Tanaka, N. Kawai, H. Seki, A. Nakano, H. Honda, Y. Iida, M. Monoi: "A White-RGB CFA-Patterned CMOS Image Sensor with Wide Dynamic Range", ISSCC 2008, Digest of Technical Papers, pp. 52-53 (2008)).

This technology utilizes the ability of white (W) pixels to read larger signal current than RGB pixels, thereby obtaining a high SN ratio (signal/noise ratio). The solid-state imaging device illustrated in FIG. 8A, in contrast, is not capable of directly reading the signal current of white (W) wavelength light.

In the solid-state imaging devices of the related art illustrated in FIGS. 6 and 7C, the pixel structure formed below the color filters 106B, 106G, 106R, B1, G1, and R1 is formed using advanced CMOS micromachining technology.

However, the CMOS micromachining technology is not available for the formation of the color filters 106B, 106G, 106R, B1, G1, and R1. The color filters 106B, 106G, 106R, B 1, G1, and R1 are formed using photolithography technology that utilizes a different photoresist material.

Therefore, the micromachining dimensions of the color filters 106B, 106G, 106R, B1, G1, and R1 are greater (larger) than the micromachining dimensions which are realized by the advanced CMOS micromachining technology. The micromachining technology for the color filters 106B, 106G, 106R, B1, G1, and R1 thus limits a further increase in the pixel density of CMOS solid-state imaging devices.

In addition, the process and apparatus for forming the color filters 106B, 106G, 106R, B1, G1, and R1 are different from the process and apparatus used in advanced CMOS micromachining technology, which may cause an increase in cost. This imposes a problem of reduction in the cost of solid-state imaging devices.

Additionally, in the solid-state imaging devices of the related art illustrated in FIGS. 6 and 7C, the material of the R, G, and B color filters 106R, 106G, 106B, B1, G1, and R1 causes light absorption, which thus prevents the color filters 106R and R1 from achieving a light transmittance of 100% in the red (R) wavelength region. Similarly to this, the color filters 106G and G1 and the color filters 106B and B1 for blue (B) are also prevented from achieving a light transmittance of 100% in the green (G) wavelength region and the blue (B) wavelength region, respectively. In this manner, light absorption which prevents improvements in the light transmittance of the color filters 106R, 106G, 106B, B 1, G1, and R1 hinders the sensitivity of CMOS color solid-state imaging devices from increasing.

In the solid-state imaging device of the related art illustrated in FIG. 8A, furthermore, the diode regions 126a, 126b, and 126c where photoelectric conversion is performed on RGB wavelength light are formed so as to overlap one another in the depth direction, and the N region 124 that receives blue (B) wavelength light, which is required to have the largest light-receiving area, is formed inside the P region 123 and the N region 122. Thus, a large pixel size is used to obtain desired blue (B) wavelength light sensitivity. There is another difficulty in that the solid-state imaging device is not capable of directly obtaining signals of white (W) wavelength light including all of blue (B) wavelength light, green (G) wavelength light, and red (R) wavelength light, and it is difficult to achieve a high sensitivity and a wide dynamic range utilizing white (W) wavelength light signals.

SUMMARY OF THE INVENTION

In an aspect of the present invention, a solid-state imaging device including a plurality of pixels which are formed of island-shaped semiconductors, the plurality of pixels being two-dimensionally arranged in a pixel region, includes first semiconductor regions formed on a substrate, base semiconductor regions formed on the first semiconductor regions, second semiconductor regions formed on outer peripheries of the base semiconductor regions which are spaced away from the first semiconductor regions, and third semiconductor regions formed above the second semiconductor regions so as to adjoin the base semiconductor regions. The base semiconductor regions form the island-shaped semiconductors. The second semiconductor regions form diodes together with the base semiconductor regions. The third semiconductor regions have a conductivity type opposite to a conductivity type of the second semiconductor regions. The third semiconductor region includes a sufficient quantity of acceptor or donor impurities that signal charges generated by absorption of incident light incident on top surfaces of upper ends of the island-shaped semiconductors in the third semiconductor regions are recombined and disappear in the third semiconductor regions. The island-shaped semiconductors are formed to include the third semiconductor regions having at least two different thicknesses. In the island-shaped semiconductors, a color filter of a primary color or a complementary color is formed over the third semiconductor region of a first island-shaped semiconductor including the third semiconductor region having the smallest thickness or a second island-shaped semiconductor including the third semiconductor region having the second smallest thickness, and light transmitted through the color filter includes a light wavelength component which undergoes light absorption and accumulation of signal charges in the diode region in the first island-shaped semiconductor or second island-shaped semiconductor located below the color filter. The solid-state imaging device performs an imaging operation which includes a photoelectric conversion operation, a signal charge accumulating operation, an accumulated signal charge quantity read operation, and a signal charge discharging operation. The photoelectric conversion operation is an operation for absorbing light incident on the top surfaces of the upper ends of the island-shaped semiconductors, in diode regions formed by the second semiconductor regions and the base semiconductor regions, and generating signal charges. The signal charge accumulating operation is an operation for accumulating the generated signal charges in the diode regions. The accumulated signal charge quantity read operation is an operation for sensing the quantity of signal charges accumulated in the diode regions by detecting a source-drain current flowing through junction field-effect transistors. The junction field-effect transistors have sources or drains which are defined by the first semiconductor regions or the third semiconductor regions, gates which are defined by the second semiconductor regions, and channels which are defined by the base semiconductor regions surrounded by the second semiconductor regions. The signal charge discharging operation is an operation for discharging the signal charges accumulated in the diode regions to the first semiconductor regions.

The first island-shaped semiconductor may have the third semiconductor region that transmits blue wavelength light, green wavelength light, and red wavelength light which are incident on the top surfaces of the upper ends of the island-shaped semiconductor. The second island-shaped semiconductor may have the third semiconductor region that absorbs blue wavelength light which is incident on the top surfaces of the upper ends of the island-shaped semiconductors. The island-shaped semiconductors may further include a third island-shaped semiconductor having the third semiconductor region that absorbs blue wavelength light and green wavelength light which are incident on the top surfaces of the upper ends of the island-shaped semiconductors. The first island-shaped semiconductor, the second island-shaped semiconductor, and the third island-shaped semiconductor may be formed so that in the diode region in the first island-shaped semiconductor, photoelectric conversion is performed on the blue wavelength light, green wavelength light, and red wavelength light which are incident on the top surface of the upper end of the first island-shaped semiconductor, and signal charges obtained by the photoelectric conversion are accumulated; in the diode region in the second island-shaped semiconductor, photoelectric conversion is performed on green wavelength light and red wavelength light which are incident on the top surface of the upper end of the second island-shaped semiconductor, and signal charges obtained by the photoelectric conversion are accumulated; and in the diode region in the third island-shaped semiconductor, photoelectric conversion is performed on red wavelength light which is incident on the top surface of the upper end of the third island-shaped semiconductor, and signal charges obtained by the photoelectric conversion are accumulated. The first island-shaped semiconductor, the second island-shaped semiconductor, and the third island-shaped semiconductor may be formed so that the third semiconductor region of the first island-shaped semiconductor has a thickness less than the third semiconductor region of the second island-shaped semiconductor, and the third semiconductor region of the second island-shaped semiconductor has a thickness less than the third semiconductor region of the third island-shaped semiconductor; and the first island-shaped semiconductor, the second island-shaped semiconductor, and the third island-shaped semiconductor are adjacent to one another.

The color filter of a primary color or a complementary color may be further formed on the top of the first island-shaped semiconductor or on the top of the second island-shaped semiconductor. Light transmitted through the color filter may include a light wavelength component which undergoes light absorption and accumulation of signal charges in the diode region in the first island-shaped semiconductor or second island-shaped semiconductor located below the color filter.

The first island-shaped semiconductor having on the top thereof a color filter that transmits blue wavelength light, and the first island-shaped semiconductor not having on the top thereof the color filter that transmits the blue wavelength light may be formed in the pixel region, and a white signal current including a blue wavelength light component, a green wavelength light component, and a red wavelength light component may be obtained from the first island-shaped semiconductor not having on the top thereof the color filter that transmits the blue wavelength light.

The island-shaped semiconductors may include a fourth island-shaped semiconductor and a fifth island-shaped semiconductor. The fourth island-shaped semiconductor may have a diode region where photoelectric conversion is performed on blue wavelength light, green wavelength light, and red wavelength light transmitted through the third semiconductor region and signal charges obtained by the photoelectric conversion are accumulated. The fifth island-shaped semiconductor may have a diode region where photoelectric conversion is performed on either or both of green wavelength light and red wavelength light transmitted through the third semiconductor region and signal charges obtained by the photoelectric conversion are accumulated. The third semiconductor region of the fifth island-shaped semiconductor may have a thickness greater than or equal to the third semiconductor region of the fourth island-shaped semiconductor. A sixth island-shaped semiconductor having a structure similar to the second semiconductor region and the third semiconductor region in the fourth island-shaped semiconductor and the fifth island-shaped semiconductor may be formed in the pixel region. A color filter of a primary color or a complementary color may be formed on the top of the sixth island-shaped semiconductor. The fourth island-shaped semiconductor, the fifth island-shaped semiconductor, and the sixth island-shaped semiconductor may be formed adjacent to one another.

The island-shaped semiconductors may include a seventh island-shaped semiconductor and an eighth island-shaped semiconductor. The seventh island-shaped semiconductor may have a diode region where photoelectric conversion is performed on blue wavelength light, green wavelength light, and red wavelength light transmitted through the third semiconductor region and signal charges obtained by the photoelectric conversion are accumulated. The eighth island-shaped semiconductor may have a diode region where photoelectric conversion is performed on green wavelength light and red wavelength light transmitted through the third semiconductor region and signal charges obtained by the photoelectric conversion are accumulated. The third semiconductor region of the eighth island-shaped semiconductor may have a thickness greater than the third semiconductor region of the seventh island-shaped semiconductor. A ninth island-shaped semiconductor having a structure similar to the second semiconductor region and the third semiconductor region in the seventh island-shaped semiconductor and the eighth island-shaped semiconductor may be formed in the pixel region. A color filter of a primary color or a complementary color may be formed on the top of the ninth island-shaped semiconductor. The seventh island-shaped semiconductor, the eighth island-shaped semiconductor, and the ninth island-shaped semiconductor may be formed adjacent to one another.

In the solid-state imaging device, an insulating layer that transmits light may be formed between the substrate and the first semiconductor regions, and the thickness of the insulating layer may be set so that, of light rays incident on the top surfaces of the upper ends of the island-shaped semiconductors, a light ray returning from the insulating layer to the diode regions in the island-shaped semiconductors has more red wavelength component than green wavelength component.

In the pixel region, the island-shaped semiconductors including the third semiconductor regions having at least two different thicknesses may be arranged in a zigzag or staggered manner.

According to an aspect of the present invention, a solid-state imaging device with a high pixel density, a high sensitivity, and a wide dynamic range being achieved may be provided.

BRIEF DESCRIPTION OF THE DRAWINGS

FIG. 1A is a cross-sectional structural diagram of a solid-state imaging device according to a first embodiment of the present invention;

FIG. 2D is a cross-sectional structural diagram explaining the method for manufacturing the solid-state imaging device according to the first embodiment;

FIG. 3A is a cross-sectional structural diagram of a solid-state imaging device having a color filter for green (G) according to a second embodiment of the present invention;

FIG. 8D is a plan view of the solid-state imaging device illustrated in FIG. 8A.

DETAILED DESCRIPTION OF THE PREFERRED EMBODIMENTS

Figure 1B:
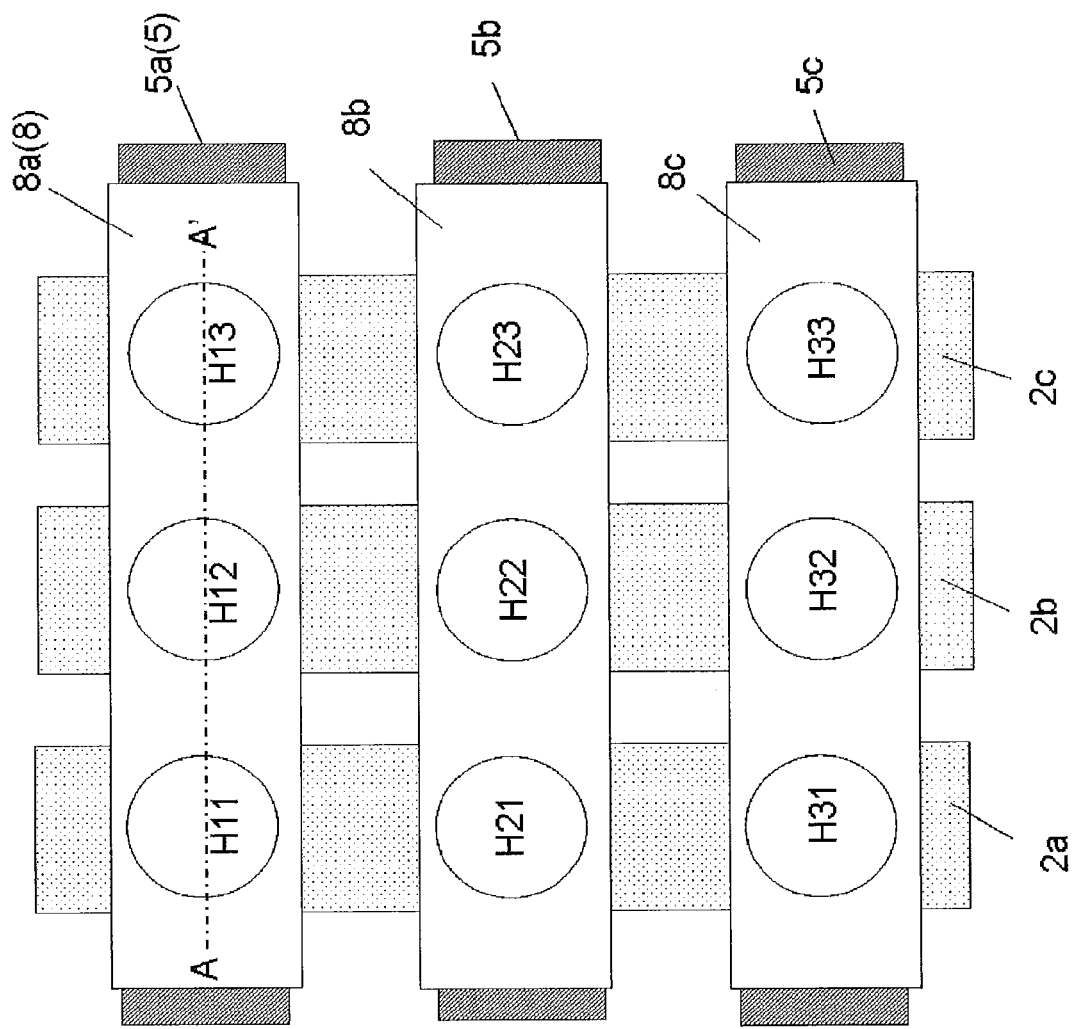
FIG. 1B is a plan view of the solid-state imaging device according to the first embodiment.

Hereinafter, solid-state imaging devices according to embodiments of the present invention and a method for manufacturing the solid-state imaging devices will be described with reference to the drawings.

First Embodiment

Hereinafter, a solid-state imaging device according to the first embodiment of the present invention will be described with reference to FIGS. 1A and 1B.

FIG. 1A illustrates a cross-sectional structure of the solid-state imaging device according to this embodiment.

As illustrated in FIG. 1A, signal line N$^+$ regions 2a, 2b, and 2c are formed on a substrate 1. Island-shaped semiconductors H1, H2, and H3 are formed on the signal line N$^+$ regions 2a, 2b, and 2c, respectively. In the island-shaped semiconductors H1, H2, and H3, P regions 3a, 3b, and 3c that are base semiconductor regions serving as the base of the island-shaped semiconductors H1, H2, and H3 are formed so as to adjoin the signal line N$^+$ regions 2a, 2b, and 2c, respectively. Insulating layers 4a, 4b, and 4c are formed on outer peripheries of the P regions 3a, 3b, and 3c, respectively, and a conductive layer 5 is formed in the outer peripheries of the island-shaped semiconductors H1, H2, and H3 with the insulating layers 4a, 4b, and 4c interposed between the conductive layer 5 and the P regions 3a, 3b, and 3c.

The conductive layer 5 is formed so as to connect the island-shaped semiconductors H1, H2, and H3 to one another. N regions 6a, 6b, and 6c are formed on the outer peripheral surfaces of the island-shaped semiconductors H1, H2, and H3 in the outer peripheries of the P regions 3a, 3b, and 3c above upper ends of the conductive layer 5. P$^+$ regions 7a, 7b, and 7c are formed in the top layer portions of the upper ends of the island-shaped semiconductors H1, H2, and H3 so as to come into contact with the N regions 6a, 6b, and 6c and the P regions 3a, 3b, and 3c.

In this embodiment, the heights (thicknesses) of the P$^+$ regions 7a, 7b, and 7c in the island-shaped semiconductors H1, H2, and H3 are different from one another (in FIG. 1A, the thickness of the P$^+$ region 7a (which corresponds here to the depth from the top layer surfaces of the upper ends of the island-shaped semiconductors H1, H2, and H3 on which light is incident; hereinafter, the same applies to the P$^+$ region 7b, the P$^+$ region 7c, and so forth) is represented by L7a, the thickness of the P$^+$ region 7b is represented by L7b, and the thickness of the P$^+$ region 7c is represented by L7c), where L7a is less than L7b and L7b is less than L7c (L7a<L7b<L7c). The P$^+$ regions 7a, 7b, and 7c are connected to a pixel selection line conductive layer 8. A first interlayer insulating layer 9a is formed on the substrate 1 so as to surround the island-shaped semiconductors H1, H2, and H3. The conductive layer 5 is formed on the first interlayer insulating layer 9a, and a second interlayer insulating layer 9b is formed on or over the conductive layer 5 and the first interlayer insulating layer 9a. An overcoat insulating layer 9c is formed on or over the second interlayer insulating layer 9b and the pixel selection line conductive layer 8.

In the solid-state imaging device according to this embodiment, in the island-shaped semiconductors H1, H2, and H3, the P regions 3a, 3b, and 3c and the N regions 6a, 6b, and 6c form photodiode regions 10a, 10b, and 10c, respectively. When light is incident on the $P^+$ regions 7a, 7b, and 7c side on the top layers of the upper ends of the island-shaped semiconductors H1, H2, and H3, signal charges (here, free electrons) are generated in photoelectric conversion regions of the photodiode regions 10a, 10b, and 10c. The generated signal charges are accumulated mainly in the N regions 6a, 6b, and 6c of the photodiode regions 10a, 10b, and 10c.

The island-shaped semiconductors H1, H2, and H3 further have junction field-effect transistors having gates which are defined by the N regions 6a, 6b, and 6c, sources which are defined by the $P^+$ regions 7a, 7b, and 7c, and drains which are defined by the P regions 3a, 3b, and 3c in the vicinity of the signal line $N^+$ regions 2a, 2b, and 2c. In this solid-state imaging device, the drain-source currents (output signals) of the junction field-effect transistors change in accordance with the quantities of signal charges accumulated in the N regions 6a, 6b, and 6c, and are extracted as the signal outputs from the signal line $N^+$ regions 2a, 2b, and 2c.

The island-shaped semiconductors H1, H2, and H3 further have MOS transistors having sources which are defined by the N regions 6a, 6b, and 6c of the photodiode regions 10a, 10b, and 10c, gates which are defined by the conductive layer 5, drains which are defined by the signal line $N^+$ regions 2a, 2b, and 2c, and channels which are defined by the P regions 3a, 3b, and 3c between the N regions 6a, 6b, and 6c and the signal line $N^+$ regions 2a, 2b, and 2c.

In this solid-state imaging device, the signal charges accumulated in the N regions 6a, 6b, and 6c are discharged to the signal line $N^+$ regions 2a, 2b, and 2c by the application of the ON voltage (high-level voltage) to the conductive layer 5 that is the gate of the MOS transistors.

The cross section of the solid-state imaging device according to this embodiment is different from that of the solid-state imaging device of the related art illustrated in FIG. 7C in the following two points.

First, whereas RGB color filters (the color filters B1, G1, and R1) are formed in the solid-state imaging device of the related art, they are not formed in the solid-state imaging device according to this embodiment. Second, whereas the $P^+$ regions 117a, 117b, and 117c in the solid-state imaging device of the related art have an equal thickness, the $P^+$ regions 7a, 7b, and 7c in the solid-state imaging device according to this embodiment have different thicknesses.

Figure 8A:
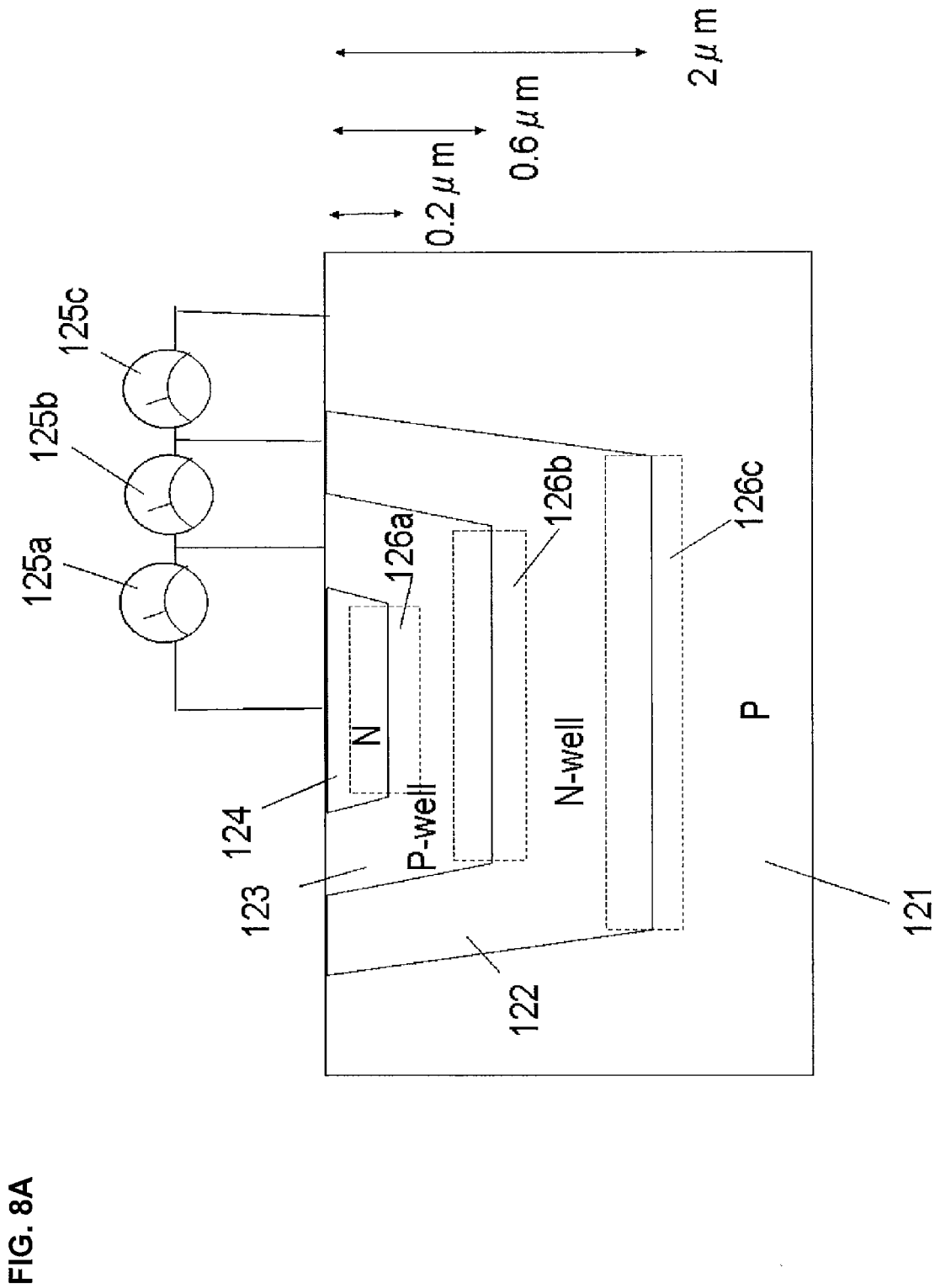
FIG. 8A is a cross-sectional structural diagram of a solid-state imaging device of the related art that is capable of color imaging without having color filters for red (R), green (G) and blue (B)
Figure 8B:
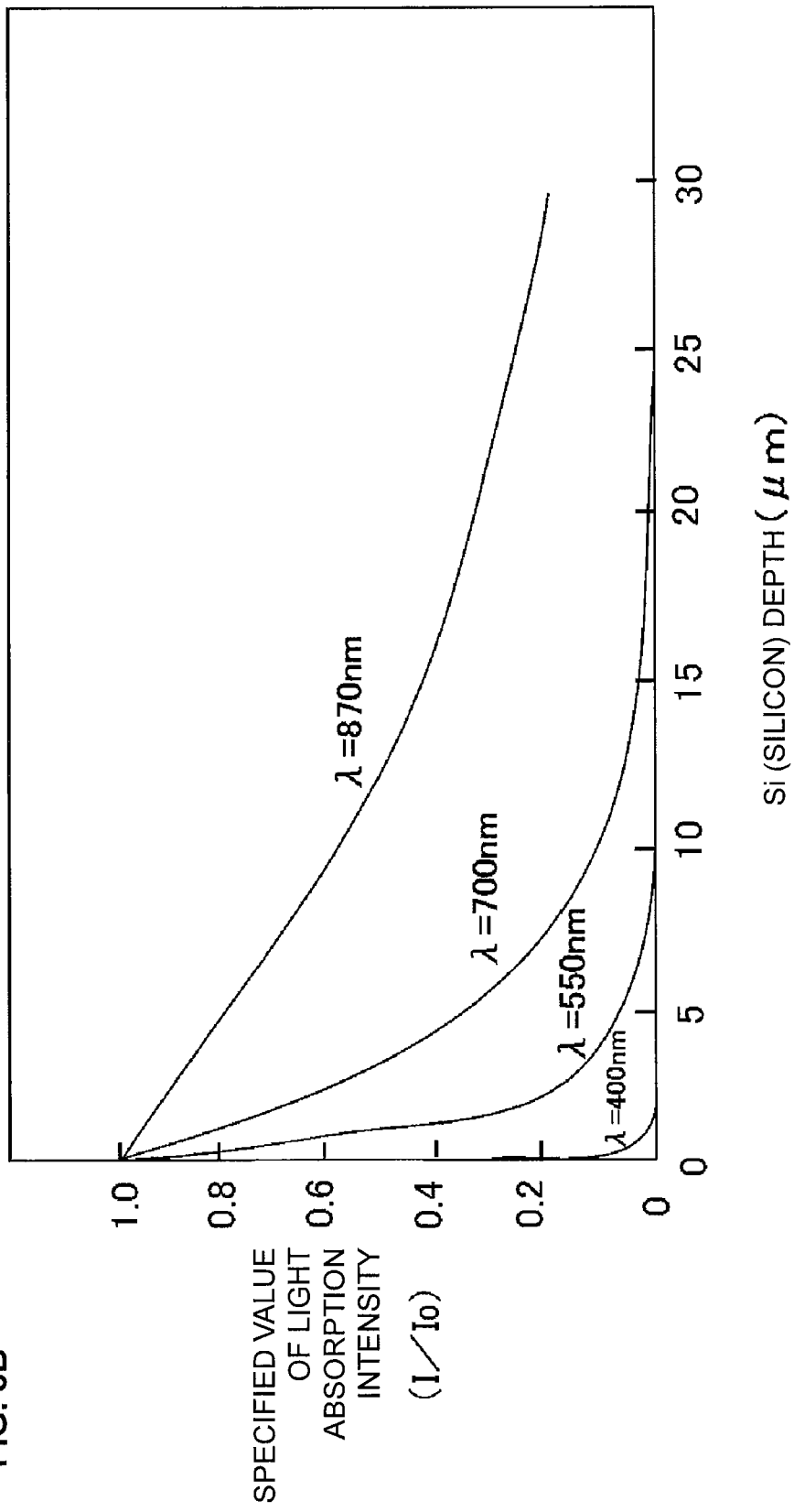
FIG. 8B illustrates the light absorption characteristics of red (R) wavelength light, green (G) wavelength light, and blue (B) wavelength light in silicon (Si) from the Si surface to the inside.
Figure 8C:
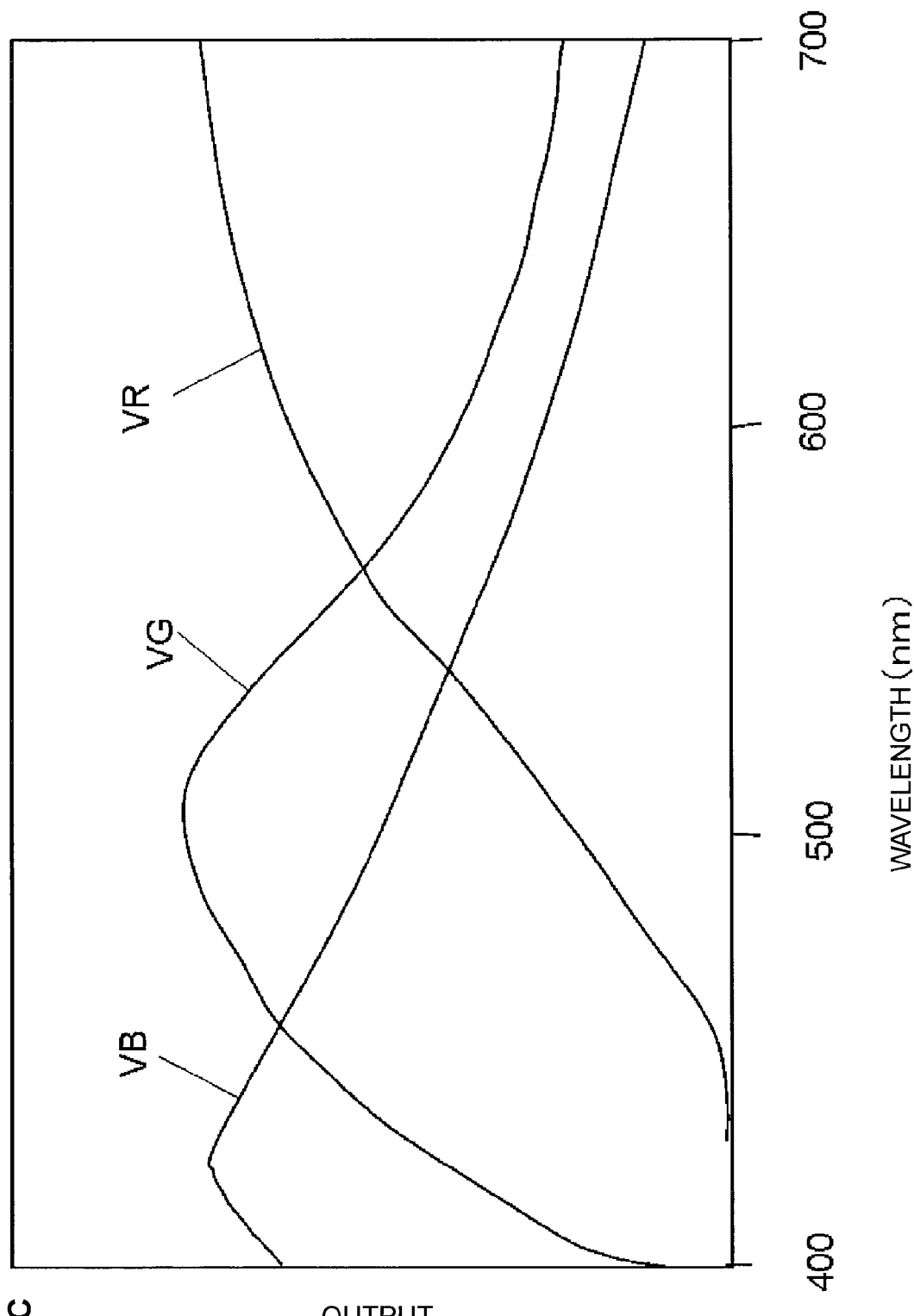
FIG. 8C illustrates the spectral sensitivity characteristics of the red (R), green (G), and blue (B) signal outputs of the solid-state imaging device illustrated in FIG. 8A.

In a case where the island-shaped semiconductors H1, H2, and H3 are formed of silicon (Si), as seen from FIG. 8B, the following dimensions and structure are desirable.

Referring to FIG. 1A, the thickness L7a of the $P^+$ region 7a is desirably less than or equal to 0.1 μm. The thickness L7b of the $P^+$ region 7b is desirably approximately 0.4 μm, and the thickness L7c of the $P^+$ region 7c is desirably approximately 1.2 μm. The height of the island-shaped semiconductors H1, H2, and H3 is desirably approximately 2 μm, and the conductive layer 5 surrounding the island-shaped semiconductors H1, H2, and H3 desirably has a height LG of 0.2 μm or less. The thicknesses of these constituent elements depend on the light transmission characteristics of an infrared cut-off filter disposed on the top surface of the solid-state imaging device in order to obtain the desired spectral sensitivity characteristics, or depend on the desired color reproduction characteristics.

A large number of positive holes (holes) exist in the $P^+$ regions 7a, 7b, and 7c. Signal charges (in this case, free electrons) generated by the light absorbed in the $P^+$ regions 7a, 7b, and 7c in the incident light incident on the top surface of the $P^+$ regions 7a, 7b, and 7c are recombined with the large number of positive holes existing in the $P^+$ regions 7a, 7b, and 7c and disappear. The $P^+$ regions 7a, 7b, and 7c are thus regions insensitive to light. In the island-shaped semiconductors H1, H2, and H3, in contrast, the N regions 6a, 6b, and 6c and the P regions 3a, 3b, and 3c form the photodiode regions 10a, 10b, and 10c, respectively, and the photodiode regions 10a, 10b, and 10c serve as photoelectric conversion regions. The signal charges generated in the photoelectric conversion regions are accumulated mainly in the N regions 6a, 6b, and 6c.

Referring to FIG. 1A, in the island-shaped semiconductor H1, since the thickness L7a of the $P^+$ region 7a is less than or equal to 0.1 μm, signal charges are generated in the photodiode region 10a formed by the N region 6a and the P region 3a, mainly due to blue (B) wavelength light, green (G) wavelength light, and red (R) wavelength light that are incident on the top surface of the $P^+$ region 7a. The resulting signal charges are accumulated mainly in the N region 6a.

In the island-shaped semiconductor H2, since the thickness L7b of the $P^+$ region 7b is approximately 0.4 μm, the blue (B) wavelength light in the incident light incident on the top surface of the $P^+$ region 7b is absorbed in the $P^+$ region 7b. In the photodiode region 10b formed of the N region 6b and the P region 3b, thus, signal charges are generated mainly due to the green (G) wavelength light and the red (R) wavelength light, and the generated signal charges are accumulated mainly in the N region 6b.

In the island-shaped semiconductor H3, since the thickness L7c of the $P^+$ region 7c is approximately 1.2 μm, the blue (B) wavelength light and the green (G) wavelength light are absorbed in the $P^+$ region 7c. In the photodiode region 10c formed of the N region 6c and the P region 3c, thus, signal charges are generated mainly due to the red (R) wavelength light that is incident on the top surface of the $P^+$ region 7c, and the generated signal charges are accumulated mainly in the N region 6c. The signal charges accumulated in the N regions 6a, 6b, and 6c are read from the signal line $N^+$ regions 2a, 2b, and 2c as the signal currents by the application of a high-level voltage to the conductive layer 5.

The signal charges read from the signal line $N^+$ region 2b are those generated mainly from the incident green (G) wavelength light and red (R) wavelength light, and the signal charges read from the signal line $N^+$ region 2c are those generated mainly from the incident red (R) wavelength light. Thus, the signal current originating from the signal line $N^+$ region 2c is subtracted from the signal current originating from the signal line $N^+$ region 2b using an external computation circuit to obtain a green (G) signal. The signal current read from the signal line $N^+$ region 2a is a signal generated mainly from the incident red (R) wavelength light, green (G) wavelength light, and blue (B) wavelength light. Thus, the green (G) signal obtained through the computation process described above and the red (R) signal are subtracted from the signals read from the signal line $N^+$ region 2a, which are mainly based on the blue (B) wavelength light, the green (G) wavelength light, and the red (R) wavelength light, using an external circuit to obtain a blue (B) signal. Accordingly, the island-shaped semiconductor H1 serves as a pixel for blue (B), the island-shaped semiconductor H2 serves as a pixel for green (G), and the island-shaped semiconductor H3 serves as a pixel for a red (R). In this way, the solid-state imaging device according to this embodiment is capable of color imaging without having RGB color filters.

FIG. 1B illustrates a plan view of the solid-state imaging device according to this embodiment in which pixels including the island-shaped semiconductors H1, H2, and H3 illustrated in FIG. 1A are arranged in a two-dimensional manner (in a matrix). The cross-sectional view taken along the one-dot chain line A-N in FIG. 1B corresponds to that illustrated in FIG. 1A.

As illustrated in FIG. 1B, island-shaped semiconductors H11 to H33 are two-dimensionally arranged (H11, H12, and H13 correspond to H1, H2, and H3 in FIG. 1A, respectively). Signal line $N^+$ regions 2a, 2b, and 2c are formed in a band shape extending in a longitudinal direction. The island-shaped semiconductors H11, H21, and H31 of pixels for blue (B) are arranged on the signal line $N^+$ region 2a. The island-shaped semiconductors H12, H22, and H32 of pixels for green (G) are arranged on the signal line $N^+$ region 2b. The island-shaped semiconductors H13, H23, and H33 of pixels for red (R) are arranged on the signal line $N^+$ region 2c.

A conductive layer 5a (which corresponds to the conductive layer 5 in FIG. 1A), a conductive layer 5b, and a conductive layer 5c are formed so as to surround outer peripheries of the island-shaped semiconductors H11 to H13, H21 to H23, and H31 to H33 arranged in the horizontal direction, respectively, and so as to connect the island-shaped semiconductors H11 to H13, H21 to H23, and H31 to H33 to one another.

Further, a pixel selection line conductive layer 8a (which corresponds to the pixel selection line conductive layer 8 in FIG. 1A), a pixel selection line conductive layer 8b, and a pixel selection line conductive layer 8c are formed so as to surround the outer peripheries of the island-shaped semiconductors H11 to H13, H21 to H23, and H31 to H33 arranged in the horizontal direction, respectively, and so as to connect the island-shaped semiconductors H11 to H13, H21 to H23, and H31 to H33 to one another.

Figure 7A:
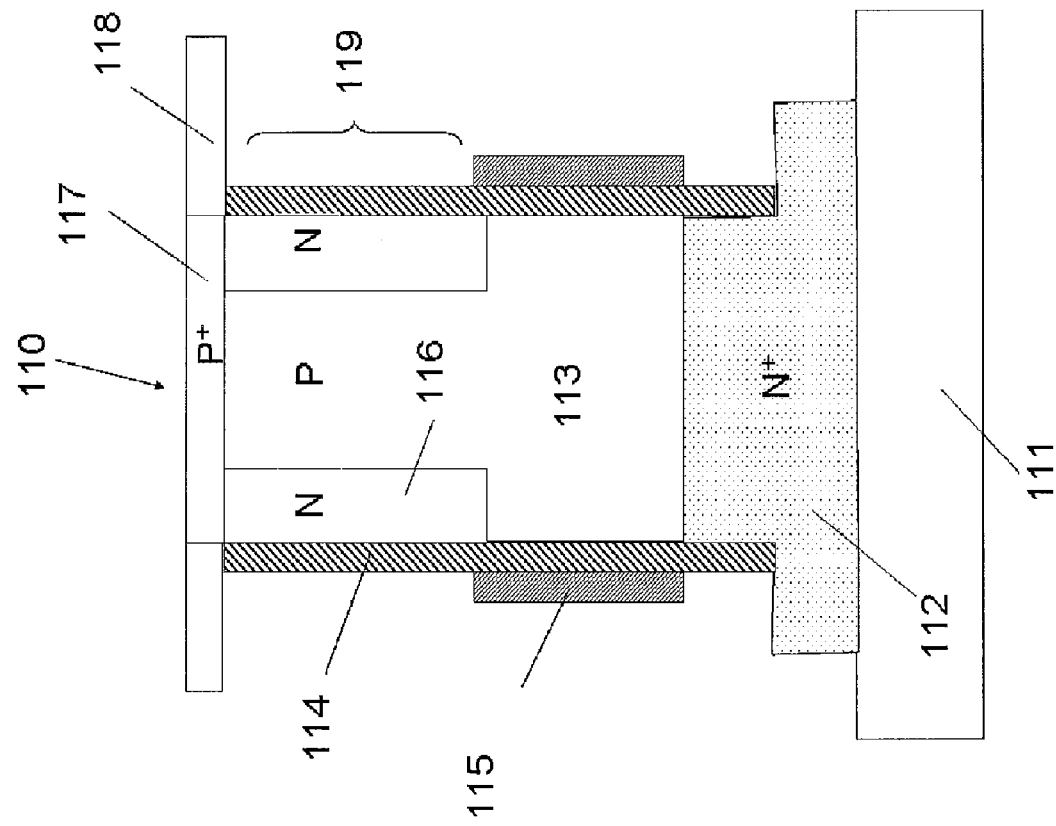
FIG. 7A is a cross-sectional structural diagram of a solid-state imaging device of the related art in which one pixel is formed in one island-shaped semiconductor.
Figure 7B:
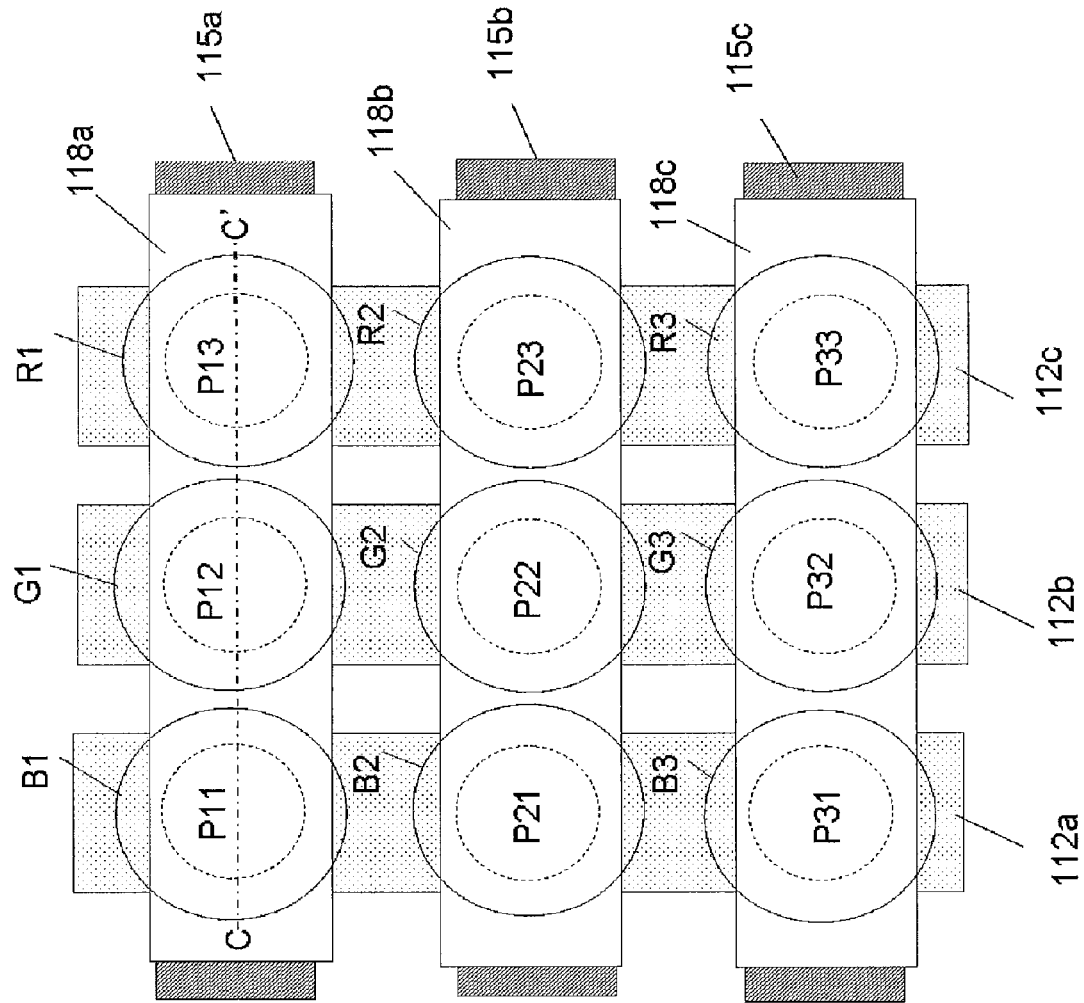
FIG. 7B is a plan view of a solid-state imaging device of the related art including island-shaped semiconductors that are two-dimensionally arranged.

In the solid-state imaging device according to this embodiment, signals are read from the pixels H11 to H33 through an operation similar to that of the solid-state imaging device of the related art illustrated in FIG. 7B. Accordingly, this solid-state imaging device is capable of color imaging without providing RGB color filters on the island-shaped semiconductors H11 to H33.

The solid-state imaging device according to this embodiment illustrated in FIG. 1B does not require the RGB color filters B1, B2, B3, R1, R2, R3, G1, G2, and G3, which are required in the solid-state imaging device of the related art illustrated in FIG. 7B. In the solid-state imaging device of the related art illustrated in FIG. 7B, since the RGB color filters B1, B2, B3, R1, R2, R3, G1, G2, and G3 are formed so as to surround the island-shaped semiconductors P11 to P33, spaces are required between the island-shaped semiconductors P11 to P33 in order to ensure a mask alignment margin in manufacturing.

In contrast, the solid-state imaging device according to this embodiment does not need to ensure a mask alignment margin in manufacturing, and can correspondingly reduce the spaces between the island-shaped semiconductors P11 to P33. Hence, a high pixel density due to the increase in the density at which the island-shaped semiconductors H11 to H33 are formed or a high sensitivity due to the increase in the diameter of the island-shaped semiconductors H11 to H33 can be achieved.

Figure 6:
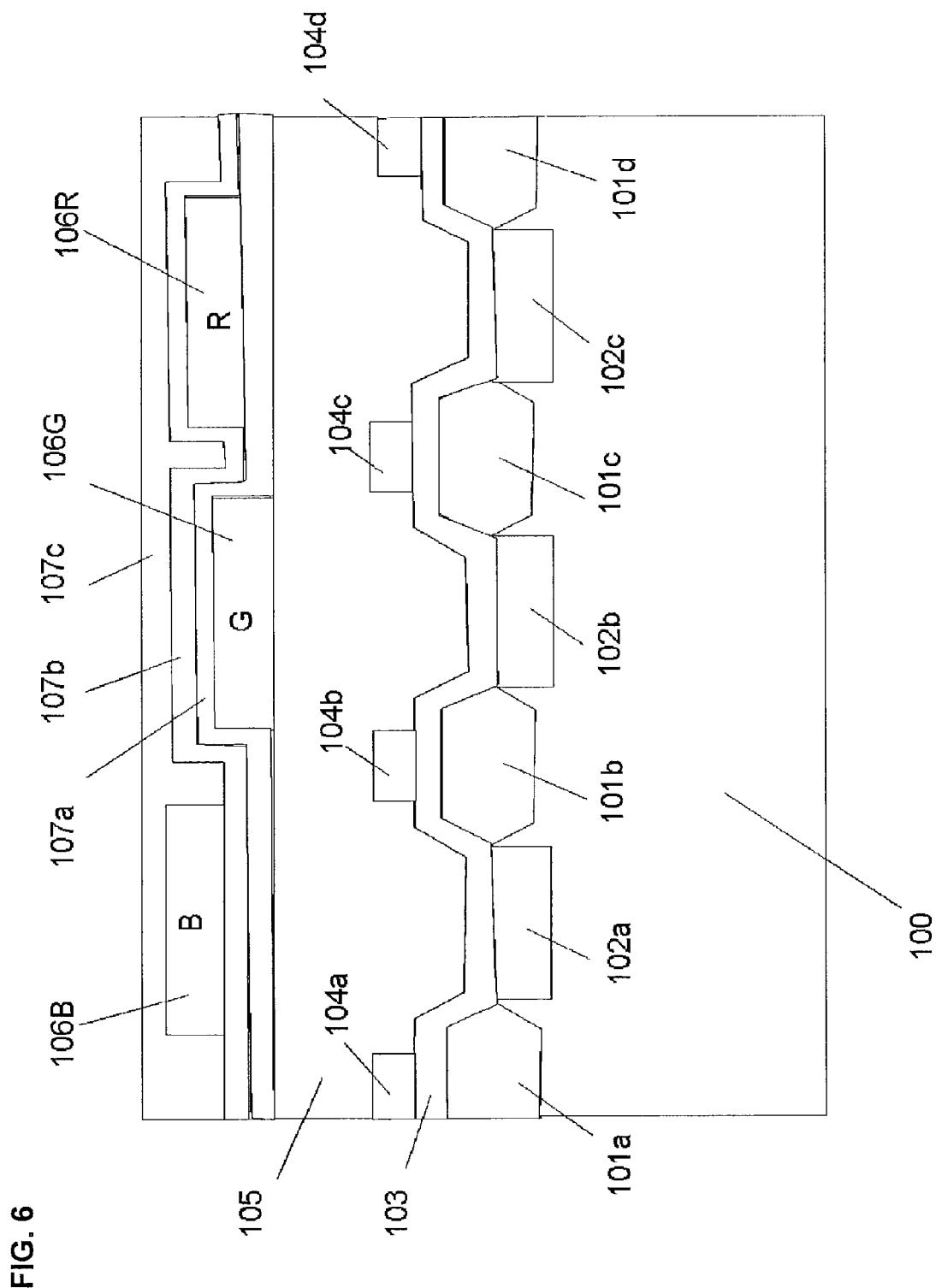
FIG. 6 is a cross-sectional structural diagram of a solid-state imaging device of the related art in which color filters for red (R), green (G) and blue (B) are formed.
Figure 7C:
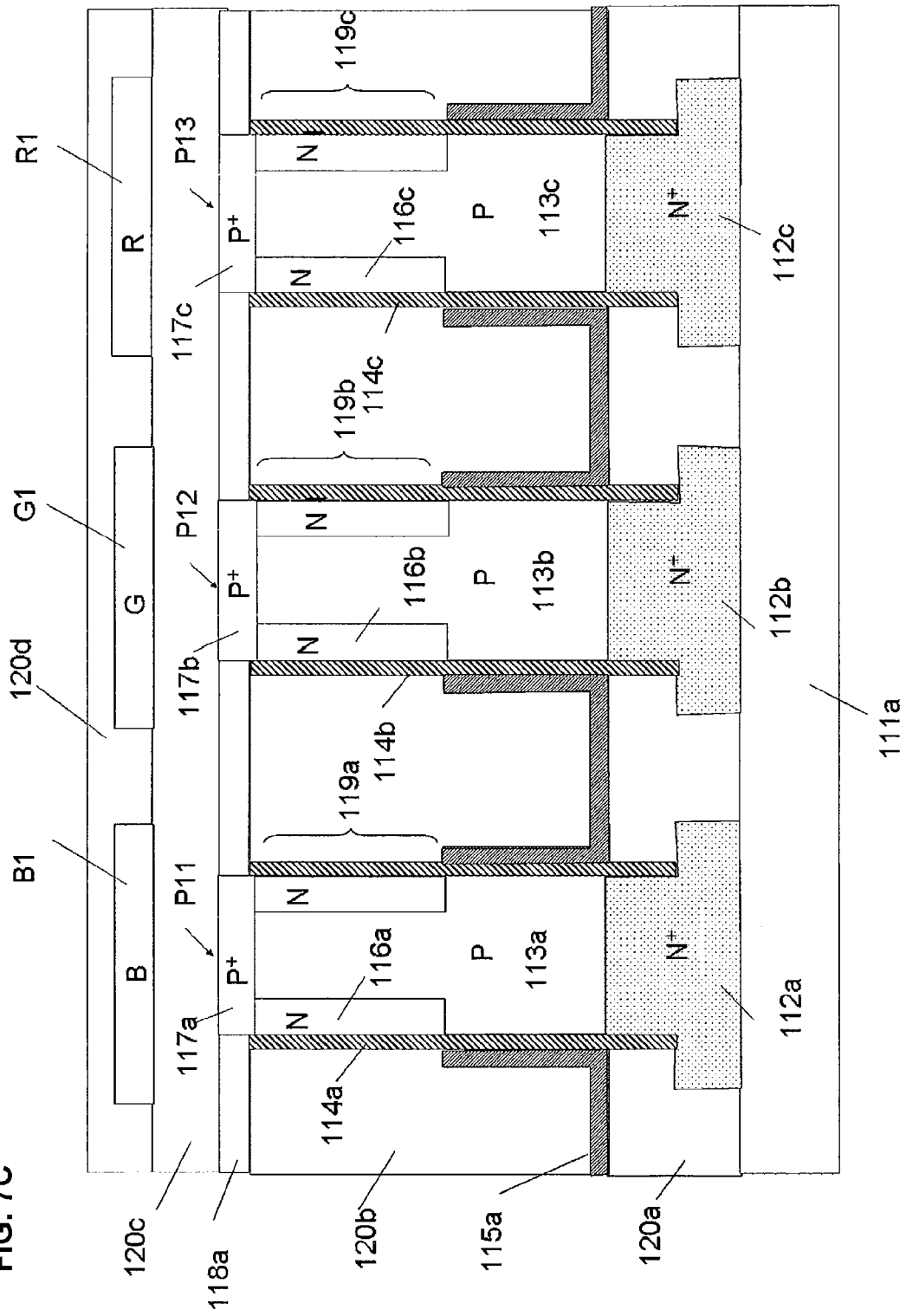
FIG. 7C is a cross-sectional structural diagram of a solid-state imaging device of the related art in which color filters for red (R), green (G) and blue (B) are formed.

Furthermore, the solid-state imaging device according to this embodiment is different from the solid-state imaging devices of the related art illustrated in FIGS. 6, 7C, and 8A in that the solid-state imaging device is capable of extracting a signal of the white (W) wavelength including light of all the blue (B), green (G), and red (R) wavelengths from the island-shaped semiconductor H1, which is a pixel for blue (B). In the solid-state imaging devices of the related art illustrated in FIGS. 6 and 7C, since RGB color filters are provided on the pixels, it is difficult to directly obtain a signal of the white (W) wavelength including light of all the blue (B), green (G), and red (R) wavelengths. In the solid-state imaging device of the related art illustrated in FIG. 8A, although it is possible to individually obtain signals of blue (B) wavelength light, green (G) wavelength light, and red (R) wavelength light from the diode regions 126a, 126b, and 126c, respectively, it is difficult to obtain a signal of the white (W) wavelength. In the solid-state imaging device according to this embodiment, in contrast, the island-shaped semiconductor H1 is a pixel for blue (B), and also functions as a pixel for white (W). Thus, a solid-state imaging device with a high sensitivity and a wide dynamic range being achieved can be obtained. Furthermore, the solid-state imaging device according to this embodiment does not require RGB color filters, and therefore cost reduction is also achieved.

In the first embodiment illustrated in FIG. 1A, RGB color signals are obtained by performing a computation process on the signal currents obtained from the signal line $N^+$ regions 2a, 2b, and 2c of the island-shaped semiconductors H1, H2, and H3 arranged in the horizontal direction. This is not to be taken in a limiting sense, and the arrangement of RGB pixels can also be changed by changing the arrangement of the $P^+$ regions (which correspond to the $P^+$ regions 7a, 7b, and 7c in FIG. 1A) on the top layers of the upper ends of the island-shaped semiconductors H11 to H33 arranged in the longitudinal direction illustrated in FIG. 1B.

Color signals are obtained by performing a computation process on the signal currents obtained from the island-shaped semiconductors H11 to H33 arranged in the longitudinal direction, which constitute color pixels for the respective colors (red, green, and blue). In this case, the island-shaped semiconductors H11 to H33 arranged in the longitudinal direction are pixels of colors which are not identical, and a solid-state imaging device for color imaging in which color pixels are arranged in a staggered manner, for example, a Bayer arrangement, is obtained. In this way, in the solid-state imaging device according to this embodiment, the arrangement of the $P^+$ regions (which correspond to the $P^+$ regions 7a, 7b, and 7c in FIG. 1A) on the top layers of the upper ends of the island-shaped semiconductors H11 to H33 is changed, thereby achieving a solid-state imaging device in which color pixels are arranged in a stripe or staggered pattern.

In FIG. 1A, the signal line $N^+$ regions 2a, 2b, and 2c have the function of the drain of the junction field-effect transistors, and the function of a drain that discharges the signal charges accumulated in the N regions 6a, 6b, and 6c. This is not to be taken in a limiting sense, and the technical idea of the present invention can also be applied to a structure in which the signal line $N^+$ regions 2a, 2b, and 2c are regions including $P^+$ regions serving as signal lines, P regions connected to the $P^+$ regions, and $N^+$ regions for discharging signal charges (see, for example, U.S. Patent Application Publication No. 2012/0025281). That is, the signal line $N^+$ regions may be formed of a plurality of semiconductor regions having certain functions. This configuration can also be applied to the other embodiments of the present invention described below.

The technical idea of the present invention can also be applied to a structure in which $P^+$ regions are disposed on outer peripheries of the island-shaped semiconductors H1, H2, and H3 between the N regions 6a, 6b, and 6c and the insulating layers 4a, 4b, and 4c (see, for example, U.S. Patent Application Publication No. 2011/0215381 and U.S. Patent Application Publication No. 2011/0220969). This configuration can also be applied to the other embodiments of the present invention described below.

In the solid-state imaging device illustrated in FIG. 1A, the signal charges accumulated in the N regions 6a, 6b, and 6c are discharged to the signal line N+ regions 2a, 2b, and 2c by the application of the ON voltage (high-level voltage) to the conductive layer 5, which is the gate of the MOS transistors. However, the signal charges may also be discharged by, instead of the application of the ON voltage (high-level voltage) to the conductive layer 5, the application of a high-level voltage simultaneously to the signal line N+ regions 2a, 2b, and 2c. This configuration can also be applied to the other embodiments of the present invention described below.

As described above, the fundamental requirements to achieve advantages of the technical idea of the present invention are as follows.

The P+ regions 7a, 7b, and 7c, which are the sources of the junction field-effect transistors and include acceptor impurities having a sufficiently high concentration to allow signal charges (free electrons) generated here to be recombined with holes (positive holes) and disappear, are formed on the top layers of the upper ends of the island-shaped semiconductors H1, H2, and H3. Furthermore, the photodiode regions 10a, 10b, and 10c where photoelectric conversion is performed and signal charges are accumulated are formed below the P+ regions 7a, 7b, and 7c. In addition, the thicknesses L7a, L7b, and L7c of the P+ regions 7a, 7b, and 7c in the island-shaped semiconductors H1, H2, and H3 are set so that the thickness L7a of the P+ region 7a is less than the thickness L7b of the P+ region 7b and the thickness L7b of the P+ region 7b is less than the thickness L7c of the P+ region 7c (L7a<L7b<L7c).

FIGS. 2A to 2D illustrate an example of a method for manufacturing the solid-state imaging device according to the first embodiment illustrated in FIG. 1A.

Figure 2A:
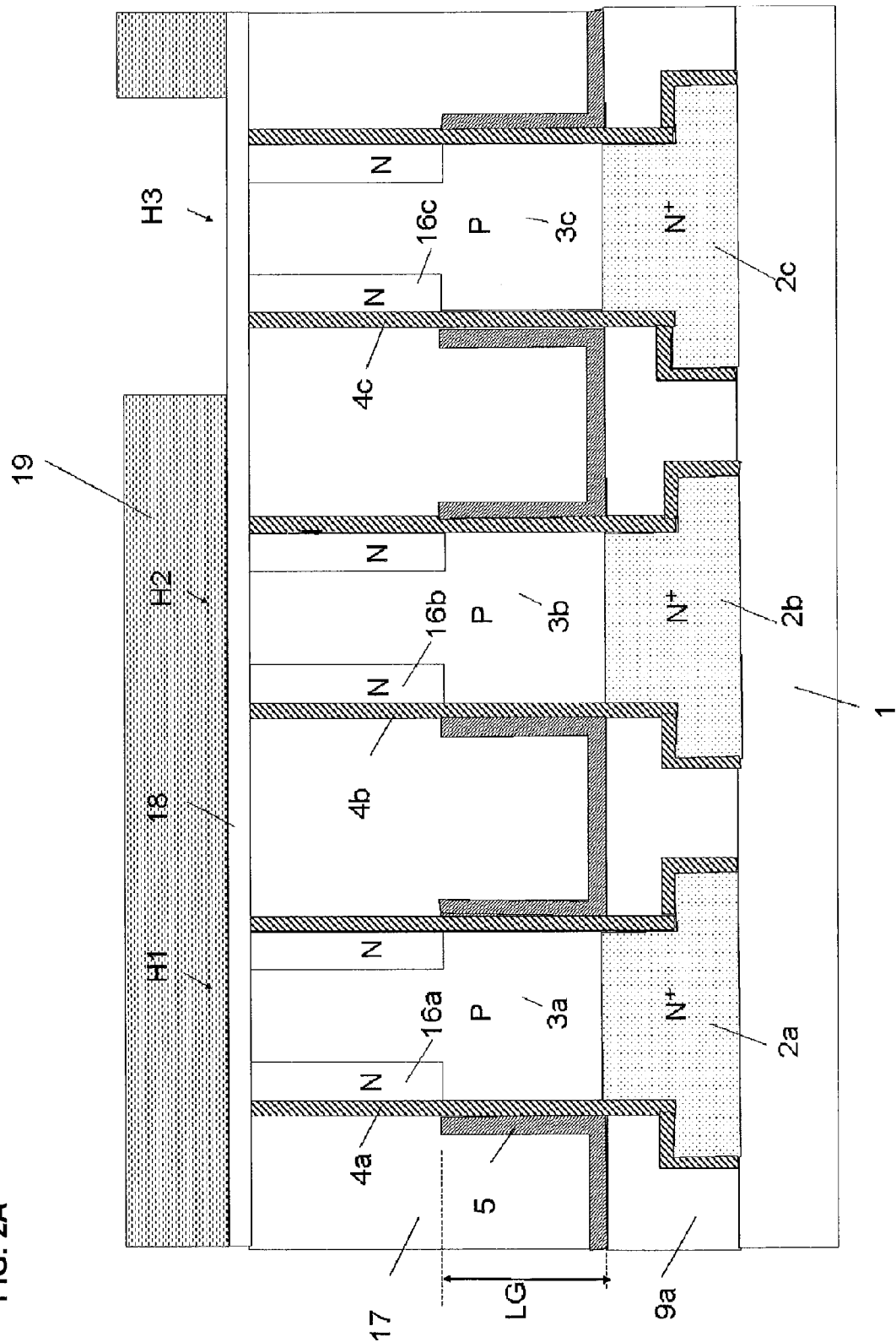
FIG. 2A is a cross-sectional structural diagram explaining a method for manufacturing the solid-state imaging device according to the first embodiment.

First, as illustrated in FIG. 2A, signal line N+ regions 2a, 2b, and 2c are formed on a substrate 1, and island-shaped semiconductors H1, H2, and H3 are formed on the signal line N+ regions 2a, 2b, and 2c.

Then, an insulating layer 9a is formed on the substrate 1 between the island-shaped semiconductors H1, H2, and H3, and insulating layers 4a, 4b, and 4c are formed on the outer peripheries of the island-shaped semiconductors H1, H2, and H3.

Then, a conductive layer 5 is formed on the insulating layer 9a and on the outer periphery of the insulating 1 layers 4a, 4b, and 4c of the island-shaped semiconductors H1, H2, and H3. N regions 16a, 16b, and 16c are further formed on the outer peripheries of the P regions 3a, 3b, and 3c of the island-shaped semiconductors H1, H2, and H3 above the conductive layer 5 by the implantation of, for example, arsenic (As) ions if the island-shaped semiconductors H1, H2, and H3 are silicon (Si).

Then, an insulating layer 17 is formed on or over the insulating layer 9a and the conductive layer 5 between the island-shaped semiconductors H1, H2, and H3. The heights of the insulating layer 17 and the island-shaped semiconductors H1, H2, and H3 are made to be equal, and the surfaces of the insulating layer 17 and the island-shaped semiconductors H1, H2, and H3 are planarized using, for example, CMP (Chemical Mechanical Polish), on which a thin insulating layer 18 is formed. A photoresist layer 19 having an opening at the island-shaped semiconductor H3 is formed over the insulating layer 17.

Figure 2B:
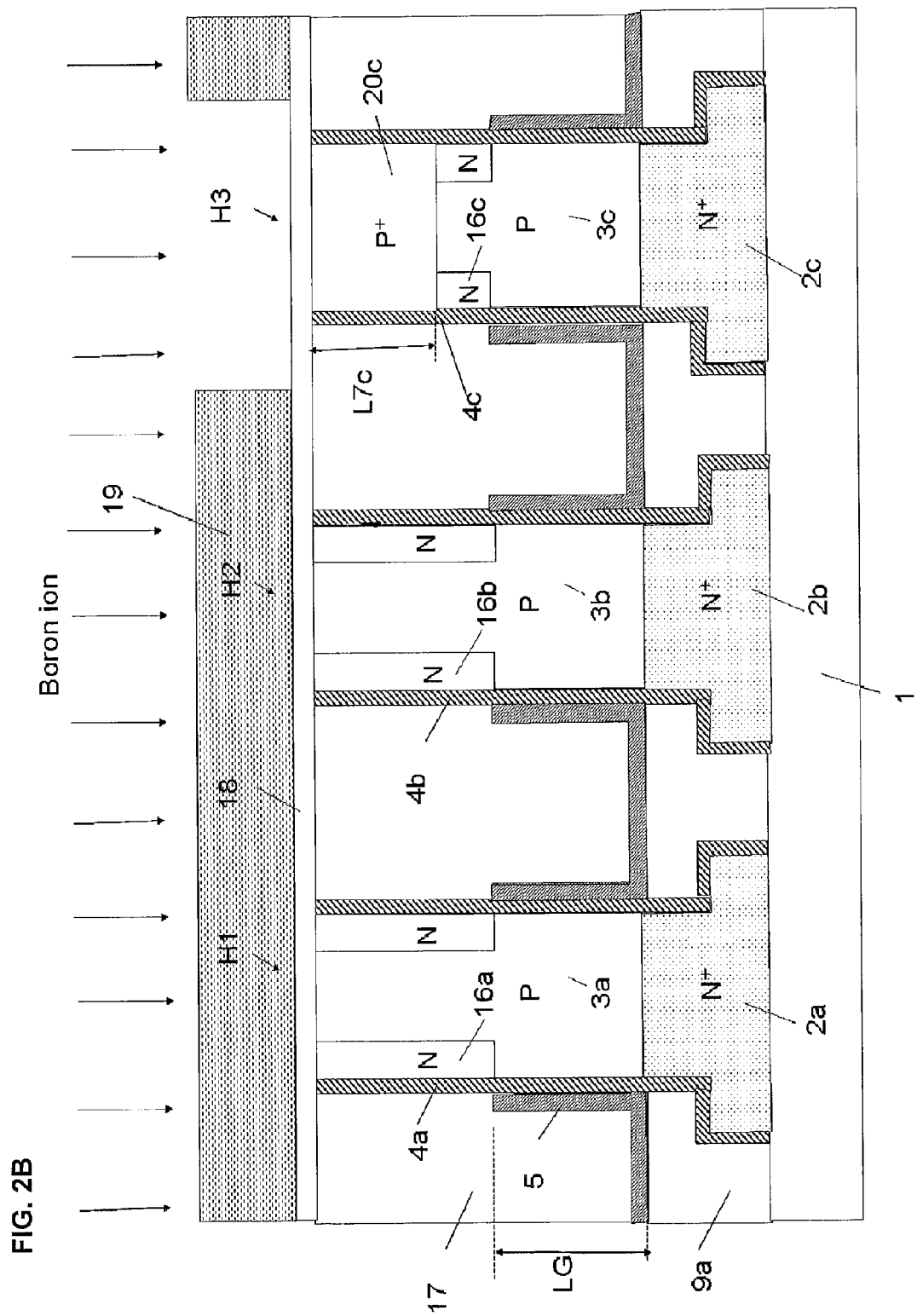
FIG. 2B is a cross-sectional structural diagram explaining the method for manufacturing the solid-state imaging device according to the first embodiment.

Then, as illustrated in FIG. 2B, for example, boron (B) ions, which are acceptor impurities, are implanted through the opening in the photoresist layer 19 to form a P+ region 20c having a depth L7c on the top layer of the upper end of the island-shaped semiconductor H3. In this case, boron (B) ions are not implanted into the island-shaped semiconductors H1 and H2 because the island-shaped semiconductors H1 and H2 are coated with the photoresist layer 19. After that, the photoresist layer 19 is removed.

Figure 2C:
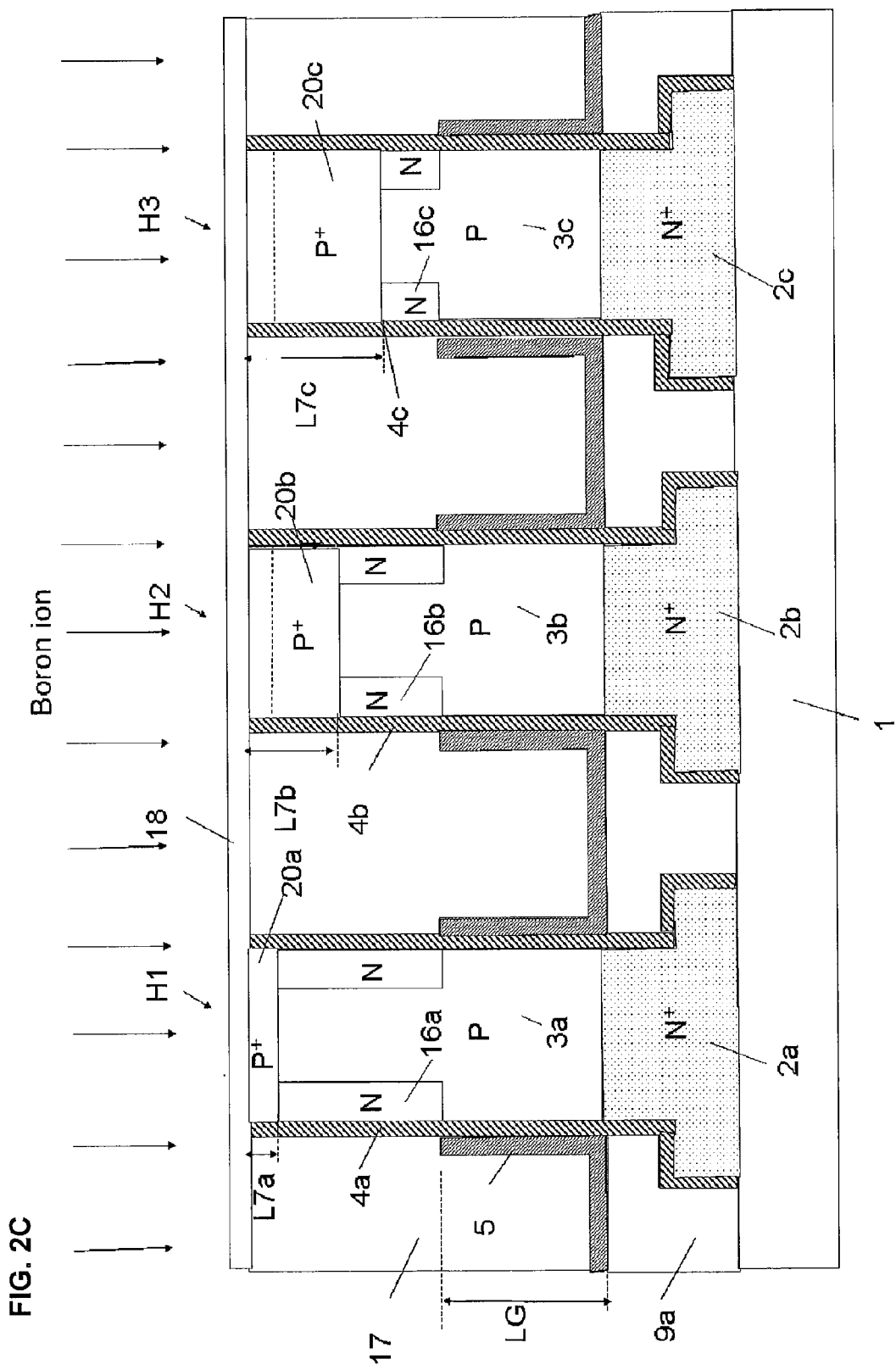
FIG. 2C is a cross-sectional structural diagram explaining the method for manufacturing the solid-state imaging device according to the first embodiment.

Then, as illustrated in FIG. 2C, a P+ region 20b having a depth L7b is formed on the top layer of the upper end of the island-shaped semiconductor H2 using a method similar to the method of forming the P+ region 20c of the island-shaped semiconductor H3 described above, and the photoresist layer is removed.

Then, boron (B) ions are implanted into the entire top layer of the insulating layer 18 to form a P+ region 20a having a depth L7a on the top layer of the upper end of the island-shaped semiconductor H1. In this case, boron (B) ions are also implanted into the top layer portions of the island-shaped semiconductors H2 and H3 to the positions indicated by the dotted lines in FIG. 2C in a manner similar to that for the island-shaped semiconductor H1. However, such implantation of boron (B) ions does not affect the electrical properties of the P+ regions 20b and 20c since a large number of boron (B) ions have been implanted into the P+ regions 20b and 20c to the positions deeper than the position in the P+ region 20a.

Then, heat treatment at, for example, approximately 1000° C. activates the arsenic (As) donor impurities ion-implanted in the N regions 16a, 16b, and 16c and the boron (B) acceptor impurities ion-implanted in the P+ regions 20a, 20b, and 20c, and the insulating layer 18 is removed.

Then, as illustrated in FIG. 2D, the insulating layer 17 and the outer peripheral insulating layers 4a, 4b, and 4c on the top layers of the upper ends of the island-shaped semiconductors H1, H2, and H3 are removed, and a pixel selection line conductive layer 8 is formed so as to adjoin the P+ regions 20a, 20b, and 20c on the insulating layer 17.

Then, an overcoat insulating layer 9c is formed on or over the P+ regions 20a, 20b, and 20c, the pixel selection line conductive layer 8, and the insulating layer 17. Thus, the solid-state imaging device according to the first embodiment illustrated in FIG. 1A is manufactured.

Second Embodiment

Hereinafter, a solid-state imaging device according to a second embodiment of the present invention will be described with reference to FIGS. 3A to 3C.

FIG. 3A illustrates a cross-sectional structural diagram of the solid-state imaging device according to this embodiment.

Referring to FIG. 3A, a pixel structure is formed in island-shaped semiconductors H1, H2, and H3 in a manner similar to that of the solid-state imaging device according to the first embodiment illustrated in FIG. 1A. An insulating layer 9d is formed on or over the interlayer insulating layer 9b and the pixel selection line conductive layer 8. The upper surface of the insulating layer 9d is planarized. A green (G) color filter 12 is formed on or over the island-shaped semiconductor H2 and the insulating layer 9d. An overcoat insulating layer 9e is formed on the insulating layer 9d and the green (G) color filter 12.

In this embodiment, similarly to the first embodiment illustrated in FIG. 1A, the island-shaped semiconductor H1 is a pixel for blue (B), the island-shaped semiconductor H2 is a pixel for green (G), and the island-shaped semiconductor H3 is a pixel for red (R).

As illustrated in FIG. 3A, since the green (G) color filter 12 is formed over the island-shaped semiconductor H2, which is a pixel for green (G), a green (G) signal is obtained directly from the signal line $N^+$ region 2b without a computation process of the signal from the signal line $N^+$ region 2c of the island-shaped semiconductor H3 illustrated in FIG. 1A. A red (R) signal is obtained directly from the island-shaped semiconductor H3, which is a pixel for red (R), in a manner as in FIG. 1A. Further, a blue (B) signal is obtained by performing a computation process on the signal from the island-shaped semiconductor H1, which is a pixel for blue (B), and the obtained green (G) signals and red (R) signals. Accordingly, RGB color signals are obtained.

In color imaging, green (G) signals are main signal components of a luminance signal which represents contours in an image, and are also integral signal components for color reproduction. Acquisition of more accurate green (G) signals implies acquisition of more exact luminance signals and color signals. Although the solid-state imaging device according to this embodiment requires the green (G) color filter 12, a solid-state imaging device for color imaging which is capable of acquiring exact green (G) signals of light coming from the subject without using three RGB color filters can be achieved, unlike the solid-state imaging devices of the related art.

Figure 3B:
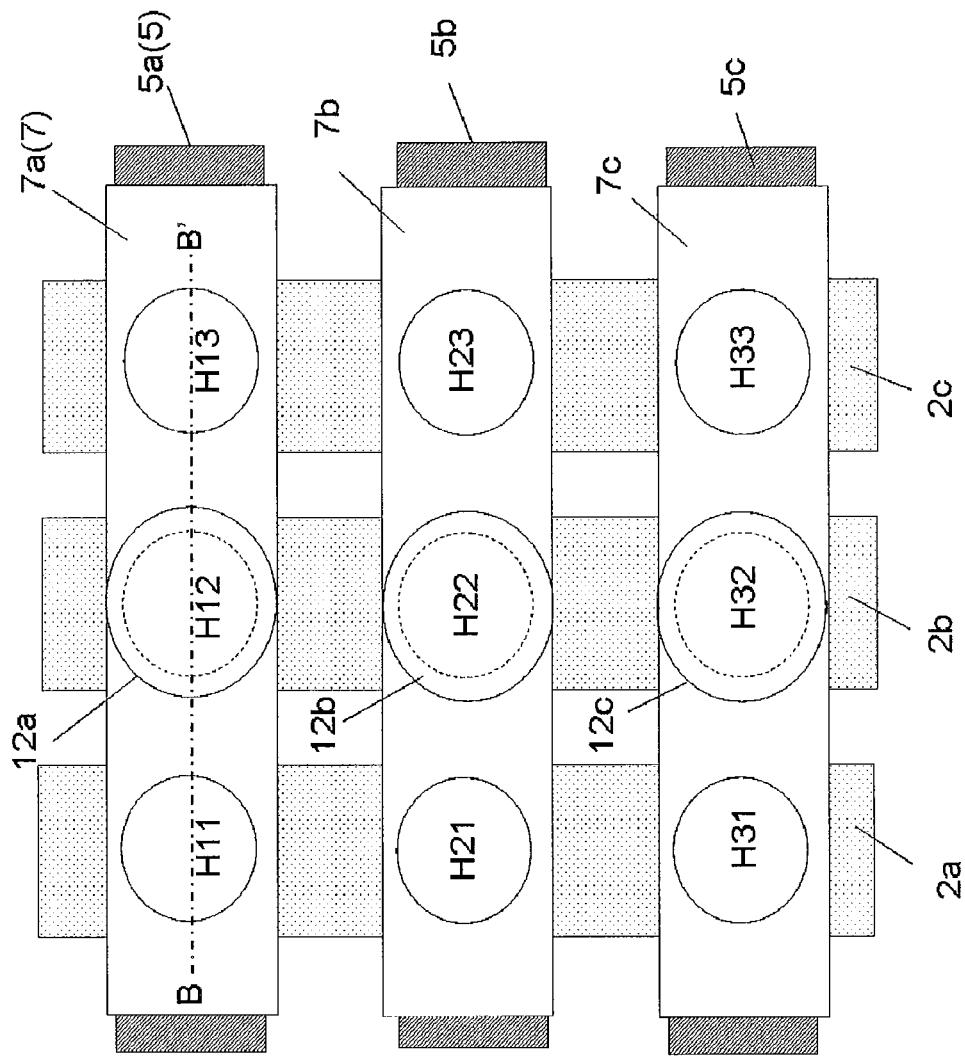
FIG. 3B is a plan view of a solid-state imaging device having a color filter for green (G) according to the second embodiment.

FIG. 3B illustrates a plan view of a solid-state imaging device in which the pixels illustrated in FIG. 3A are arranged in a two-dimensional manner (in a matrix). The cross-sectional view taken along the one-dot chain line B-B' in FIG. 3B corresponds to that illustrated in FIG. 3A.

Green (G) color filters 12a, 12b, 12c (the green (G) color filter 12a corresponds to the green (G) color filter 12 in FIG. 3A) are formed on island-shaped semiconductors H12, H22, and H32 so as to cover the island-shaped semiconductors H12, H22, and H32.

The solid-state imaging device according to this embodiment is formed in a manner similar to that for the solid-state imaging device illustrated in FIG. 1B, except the green (G) color filters 12a, 12b, and 12c. In this case, spaces are required between the green (G) color filters 12a, 12b, and 12c and the island-shaped semiconductors H12, H22, and H32 in order to ensure mask alignment margins in manufacturing. However, unlike the solid-state imaging devices of the related art, blue (B) color filters and red (R) color filters are not required. Thus, a high pixel density and cost reduction can be achieved unlike the solid-state imaging devices of the related art.

In the solid-state imaging device according to this embodiment, since green (G) signals can be directly obtained, more exact blue (B) signals of light coming from the subject than those in the solid-state imaging device according to the first embodiment can be obtained by performing a computation process on the red (R) signals obtained directly from the island-shaped semiconductors H13, H23, and H33 and the white (W) signals obtained from the island-shaped semiconductors H11, H21, and H31. Accordingly, totally higher color reproduction characteristics than those for the solid-state imaging device according to the first embodiment can be achieved. In addition, the island-shaped semiconductors H11, H21, and H31 are pixels for blue (B), and also function as pixels for white (W). Therefore, a solid-state imaging device with a high sensitivity and a wide dynamic range can be achieved.

Figure 3C:
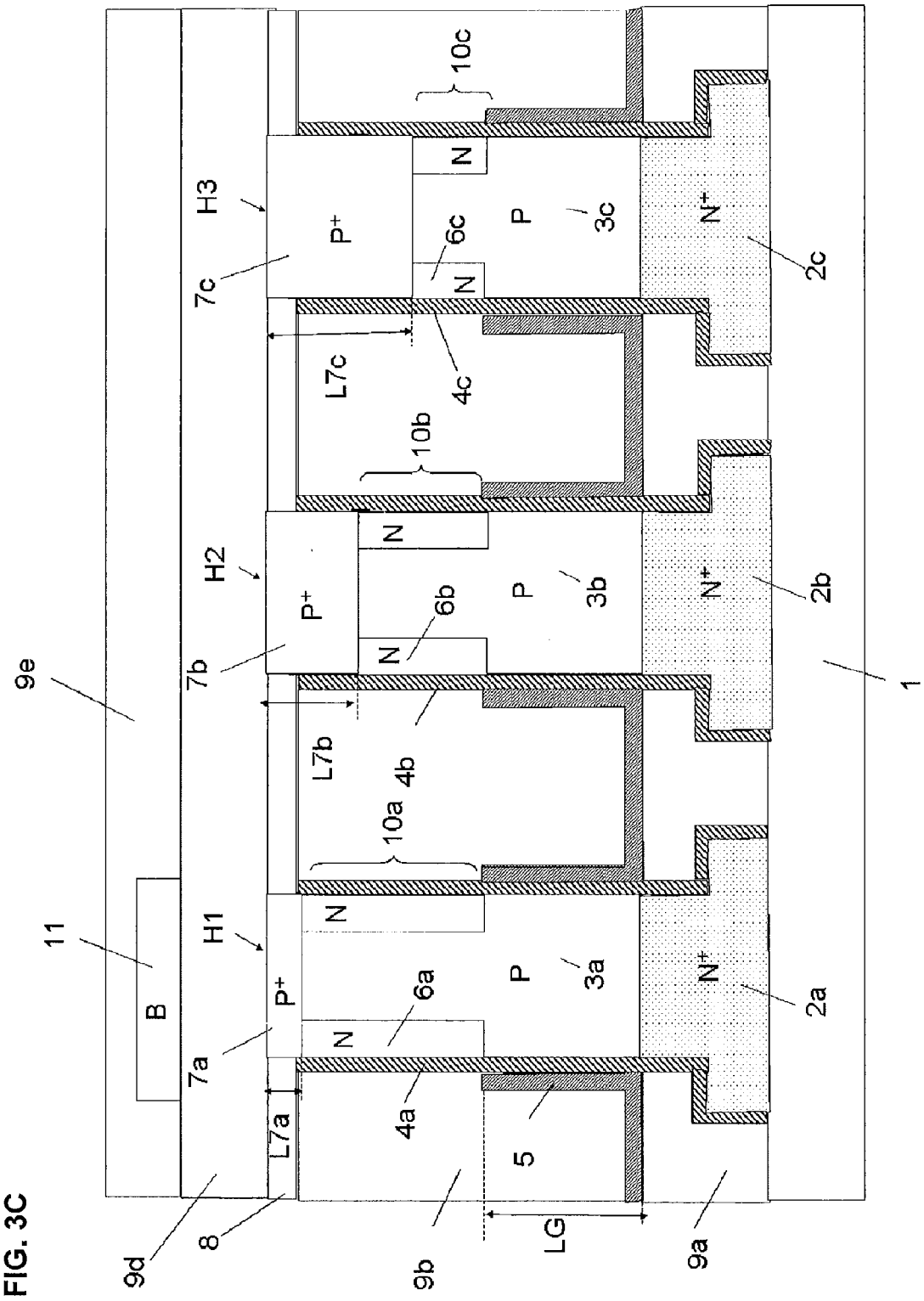
FIG. 3C is a cross-sectional structural diagram of a solid-state imaging device having a color filter for blue (B) according to the second embodiment.

FIG. 3C illustrates a cross-sectional structural diagram of a solid-state imaging device according to this embodiment in which a blue (B) color filter 11 is formed over the island-shaped semiconductor H1. The pixel structure of the island-shaped semiconductors H1, H2, and H3 is formed using a manufacturing method similar to that for the solid-state imaging device according to the first embodiment illustrated in FIG. 1A. The insulating layer 9d is formed on or over the interlayer insulating layer 9b and the pixel selection line conductive layer 8. The upper surface of the insulating layer 9d is planarized. The blue (B) color filter 11 is formed on or over the island-shaped semiconductor H1 and the insulating layer 9d. Then, an overcoat insulating layer 9e is formed on the insulating layer 9d and the blue (B) color filter 11.

In the solid-state imaging device according to this embodiment, a blue (B) signal is obtained directly from the island-shaped semiconductor H1. In general, a larger percentage of blue (B) wavelength light in the light obtained from the subject than green (G) wavelength light and red (R) wavelength light is lost before the blue (B) wavelength light reaches the photodiode region 10a, which is a photoelectric conversion region of the island-shaped semiconductor H1, due to the reflection on lens surfaces and the surface of the island-shaped semiconductor H1 and also the light absorption in the $P^+$ region 7a. Hence, a higher reproducibility of a blue (B) signal is required for the imaging of a subject including much blue (B) wavelength light component or in imaging in a dark environment. To this end, the solid-state imaging device according to this embodiment requires the blue (B) color filter 11. However, unlike the solid-state imaging devices of the related art, the solid-state imaging device according to this embodiment is capable of acquiring exact blue (B) signals of light coming from the subject without using three RGB color filters.

The solid-state imaging device according to this embodiment illustrated in FIG. 3C is not capable of acquiring a white (W) signal directly from the independent island-shaped semiconductors H1, H2, and H3. In this case, besides the island-shaped semiconductor H1 provided with the blue (B) color filter 11, an island-shaped semiconductor having a structure similar to that of the island-shaped semiconductor H1 in the case where it is not provided with the blue (B) color filter 11 is formed adjacent to the island-shaped semiconductors H1, H2, and H3. Thus, a white (W) signal can be obtained from the island-shaped semiconductor. In this case, while a larger number of island-shaped semiconductors are formed in the pixel region, a blue (B) signal having high color reproducibility can be obtained and a solid-state imaging device with a high sensitivity and a wide dynamic range can be achieved.

Applying this embodiment to a solid-state imaging device in which a red (R) color filter is formed over the island-shaped semiconductor H3 provides small benefits. The reason for this is that in this solid-state imaging device, the island-shaped semiconductor H3 can obtain a red (R) signal by itself. This implies that this embodiment provides benefits when certain color filters are disposed on island-shaped semiconductors (which correspond to the island-shaped semiconductors H1 and H2 in FIG. 1A) in order to obtain a plurality of color wavelength light component signals.

This embodiment has been described in the context of the use of a color filter of a primary color, namely, the green (G) color filter 12 or the blue (B) color filter 11. This is not to be taken in a limiting sense, and similar advantages are achieved if a color filter of a complementary color such as cyan (Cy) or magenta (Mg) is used. For example, in a case where a cyan (Cy) color filter that transmits blue (B) wavelength light and red (R) wavelength light are disposed on the island-shaped semiconductor H2, the blue (B) signal output is obtained by performing a computation process on the signal output obtained from the island-shaped semiconductor H2 and the red (R) signal output obtained from the island-shaped semiconductor H3. Further, the green (G) signal output is obtained by performing computation on the obtained red (R) signal output and blue (B) signal output and the signal output obtained from the island-shaped semiconductor H1.

Third Embodiment

Hereinafter, a solid-state imaging device according to a third embodiment will be described with reference to FIGS. 4A and 4B. This embodiment provides a further improvement of the solid-state imaging device according to the second embodiment.

Figure 4A:
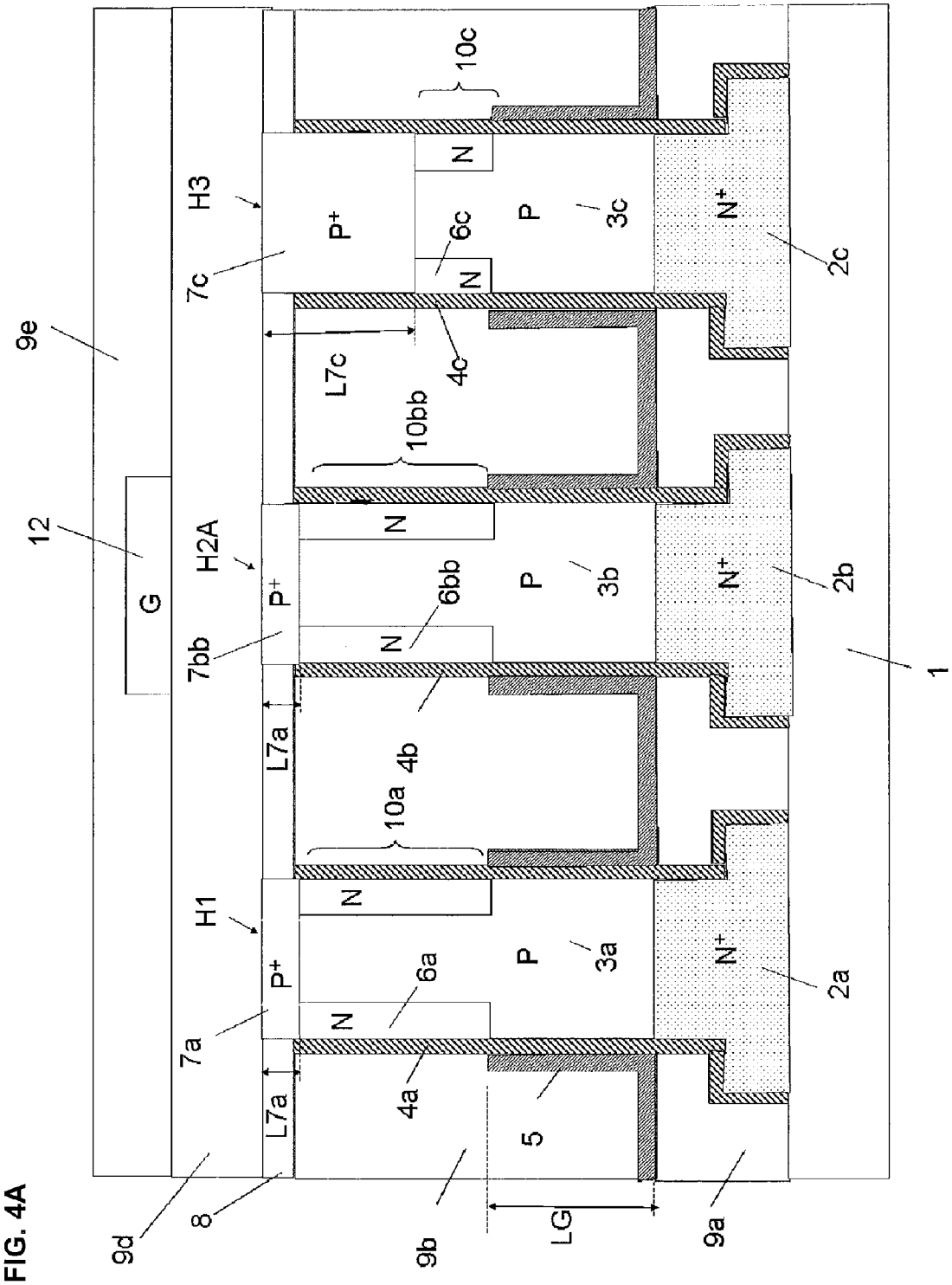
FIG. 4A is a cross-sectional structural diagram of a solid-state imaging device having a color filter for green (G) according to a third embodiment of the present invention.

FIG. 4A illustrates a cross-sectional structure of the solid-state imaging device according to this embodiment. Island-shaped semiconductors H1, H2A, and H3 are formed on the signal line N$^+$ regions 2a, 2b, and 2c. A green (G) color filter 12 is formed over the island-shaped semiconductor H2A.

In this embodiment, the structure of the island-shaped semiconductors H1 and H3 is similar to that of the island-shaped semiconductors H1 and H3 illustrated in FIG. 3A. In addition, the island-shaped semiconductor H1 is used for a blue (B) signal, and the island-shaped semiconductor H3 is used for a red (R) signal. This embodiment is different from the embodiment illustrated in FIG. 3A in that the island-shaped semiconductor H2A used for a green (G) signal has the same structure as the island-shaped semiconductor H1. The thickness of a P$^+$ region 7bb and the thickness of an N region 6bb are equal to the thickness of the P$^+$ region 7a and the thickness of the N region 6a of the island-shaped semiconductor H1, respectively. Since the green (G) color filter 12 is formed over the island-shaped semiconductor H2A, a green (G) signal can be obtained directly from the island-shaped semiconductor H2A. Accordingly, similarly to the case illustrated in FIG. 3A, unlike the solid-state imaging devices of the related art, blue (B) color filters and red (R) color filters are not required. Thus, a higher pixel density can be achieved than that of the solid-state imaging devices of the related art. In addition, totally higher color reproduction characteristics than those for the solid-state imaging device according to the first embodiment can be achieved.

In this embodiment, furthermore, the island-shaped semiconductor H1 is a pixel for blue (B), and can also function as a pixel for white (W). Therefore, a solid-state imaging device with a high sensitivity and a wide dynamic range can be achieved. In this manner, the island-shaped semiconductor structure that includes the P$^+$ regions 7a and 7bb having an equal thickness, the island-shaped semiconductors H1 and H2A, and the island-shaped semiconductor H3 including a P$^+$ region having a larger thickness than the P$^+$ regions 7a and 7bb can achieve a solid-state imaging device having features similar to those in FIG. 3A. This configuration does not require the processing step of forming the P$^+$ region 7b of the island-shaped semiconductor H2 in the solid-state imaging device illustrated in FIG. 3A, and allows simultaneous formation of the P$^+$ regions 7a and 7bb of the island-shaped semiconductors H1 and H2A. Therefore, a solid-state imaging device can be obtained at lower cost than the solid-state imaging device in FIG. 3A.

Figure 4B:
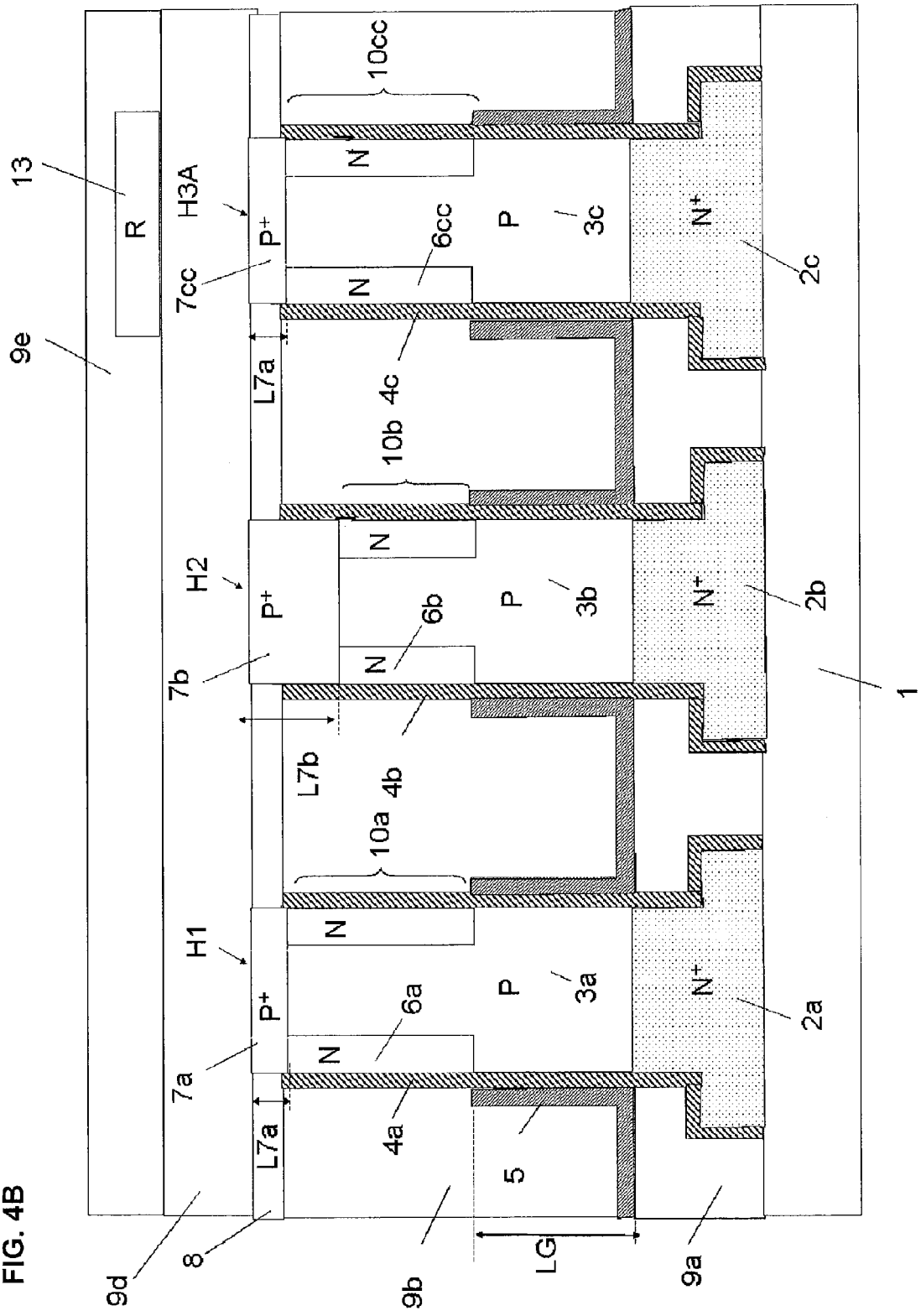
FIG. 4B is a cross-sectional structural diagram of a solid-state imaging device having a color filter for red (R) according to the third embodiment.

FIG. 4B illustrates a structural cross-sectional diagram of a solid-state imaging device according to this embodiment in which a red (R) color filter 13 is formed over an island-shaped semiconductor H3A.

As illustrated in FIG. 4B, in this embodiment, island-shaped semiconductors H1, H2, and H3A are formed on the signal line N$^+$ regions 2a, 2b, and 2c.

In this embodiment, the structure of the island-shaped semiconductors H1 and H2 is similar to that of the island-shaped semiconductors H1 and H2 illustrated in FIG. 3A. In addition, the island-shaped semiconductor H1 is used for a blue (B) signal, and the island-shaped semiconductor H2 is used for a green (G) signal. This embodiment is different from the embodiment illustrated in FIG. 3A in that the island-shaped semiconductor H3A for a red (R) signal has the same structure as the island-shaped semiconductor H1. The thickness of a P$^+$ region 7cc and the thickness of an N region 6cc are equal to the thickness of the P$^+$ region 7a and the thickness of the N region 6a of the island-shaped semiconductor H1, respectively. Since the red (R) color filter 13 is formed over the island-shaped semiconductor H3A, a red (R) signal can be obtained directly from the island-shaped semiconductor H3A. Accordingly, a color solid-state imaging device having two structures, namely, the island-shaped semiconductors H1 and H3A including the P$^+$ regions 7a and 7cc having an equal thickness, and the island-shaped semiconductor H2 including the P$^+$ region 7b having a larger thickness, can be achieved. Thus, the processing step of forming the P$^+$ region 7c of the island-shaped semiconductor H3 in the solid-state imaging device illustrated in FIG. 3A is not required, and the P$^+$ regions 7a and 7cc of the island-shaped semiconductors H1 and H3A can be formed simultaneously. Therefore, a solid-state imaging device can be obtained at lower cost than the solid-state imaging device illustrated in FIG. 3A.

Applying this embodiment to a solid-state imaging device in which a blue (B) color filter is formed over the island-shaped semiconductor H1 provides small benefits. The reason for this is that in this solid-state imaging device, the P$^+$ regions 7a, 7b, and 7c whose thicknesses are equal to those of the solid-state imaging device illustrated in FIG. 1A are required in the island-shaped semiconductors H1, H2, and H3. Applying this embodiment to a solid-state imaging device in which certain color filters such as green and green color filters are disposed on island-shaped semiconductors from which signals other than a blue (B) signal is obtained (which correspond to the island-shaped semiconductors H2 and H3 in FIG. 1A) provides benefits.

Fourth Embodiment

Hereinafter, a solid-state imaging device according to a fourth embodiment of the present invention will be described with reference to FIG. 5.

Figure 5:
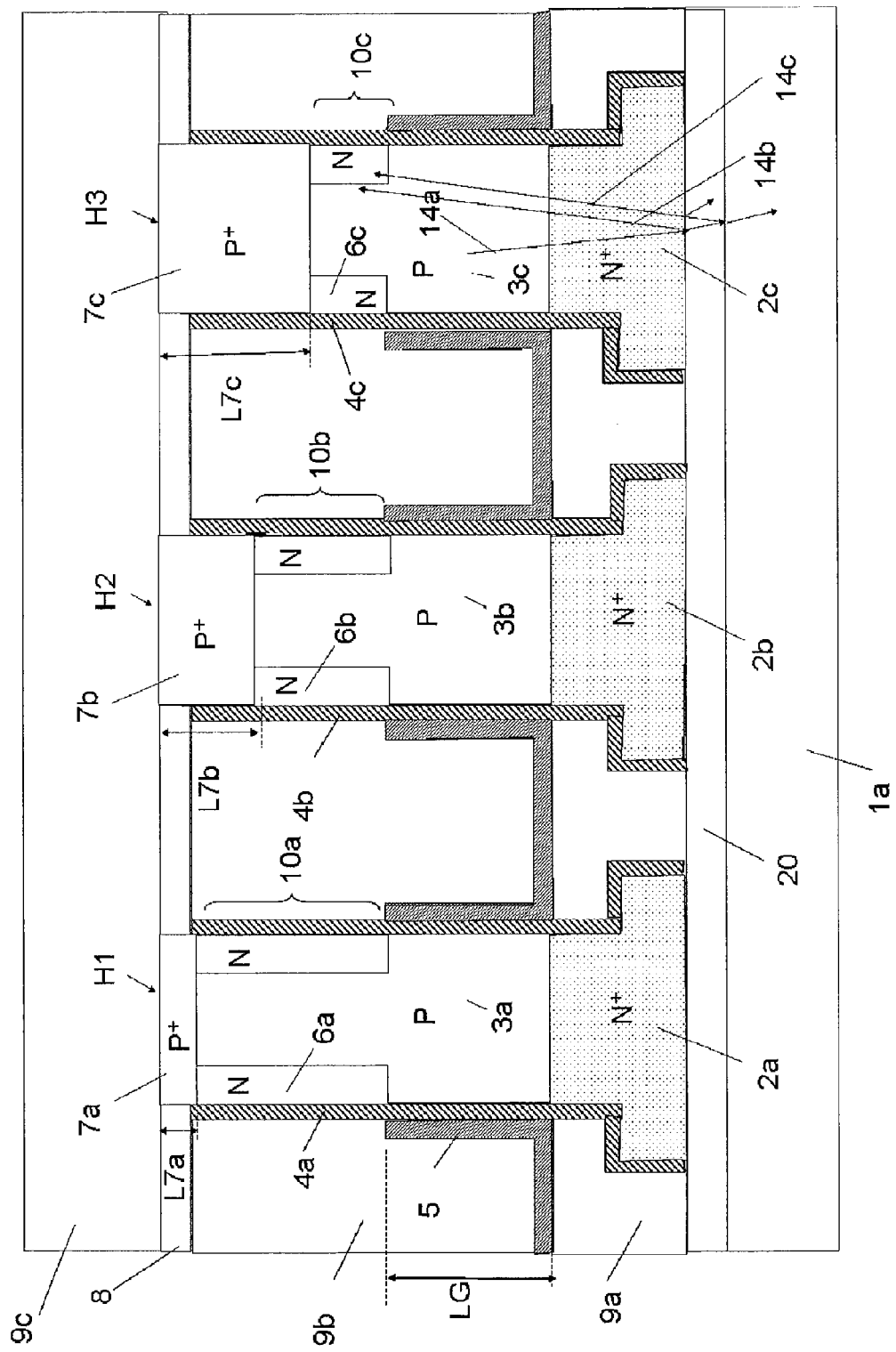
FIG. 5 is a cross-sectional structural diagram of a solid-state imaging device according to a fourth embodiment of the present invention.

Referring to FIG. 5, an insulating layer 20 that transmits light is formed on a semiconductor substrate 1a that absorbs light. After that, pixels are formed in island-shaped semiconductors H1, H2, and H3 in a manner similar to that in the first embodiment illustrated in FIG. 1A.

In the solid-state imaging device according to this embodiment, part of an incident light ray 14a that has been incident on the island-shaped semiconductor H3 for red (R) and that has reached the top surface of the insulating layer 20 is separated into a light ray that passes through the insulating layer 20 and that travels into the semiconductor substrate 1a, a reflected light ray 14b that is reflected from the interface between the signal line N$^+$ region 2c and the insulating layer 20, and a reflected light ray 14c that is reflected from the interface between the semiconductor substrate 1a and the insulating layer 20. Of these light rays, part of the reflected light rays 14b and 14c reaches the photodiode region 10c, which is a photoelectric conversion region, and generates signal charges. The thickness of the insulating layer 20 is set so that the intensity of the reflected light rays 14b and 14c is larger in red (R) wavelength light than in green (G) wavelength light due to the multiple reflection effect of the incident light ray 14a in the insulating layer 20 and the light absorption effect of the semiconductor substrate 1a.

As can be seen from the light absorption intensity characteristics illustrated in FIG. 8B of light incident on the surface of the Si (silicon) substrate in the depth direction of the Si substrate, red (R) wavelength light (wavelength λ=700 nm) is absorbed in a deeper position in the Si substrate than green (G) wavelength light (wavelength λ=550 nm). The height of the island-shaped semiconductors H1, H2, and H3, i.e., 2 μm, described above, in a case where the island-shaped semiconductors H1, H2, and H3 are formed of silicon (Si) is determined by the red (R) wavelength light absorption characteristics. An increase in the intensity of the reflected light rays 14b and 14c of the red (R) wavelength light can reduce the height of the island-shaped semiconductors H1, H2, and H3 without causing a reduction in sensitivity. In this manner, reducing the height of the island-shaped semiconductors H1, H2, and H3 can provide manufacturing advantages such as easy machining of the conductive layer 5 which is to be formed in the bottom portion of the island-shaped semiconductors H1, H2, and H3. If the island-shaped semiconductors H1, H2, and H3 have an identical height, an increase in the absorption of red (R) wavelength light in the photodiode region 10c achieves a high sensitivity of a solid-state imaging device.

In this embodiment, a transparent insulating layer is disposed between a semiconductor substrate and an island-shaped semiconductor forming a pixel. The feedback of green (G) wavelength light or red (R) wavelength light to the island-shaped semiconductor due to the multiple reflection effect in the transparent insulating layer is utilized to facilitate the manufacturing method by reducing the height of the island-shaped semiconductor or to achieve a high sensitivity (see, for example, U.S. Patent Application Publication No. 2012/104478). In the first to third embodiments, because of a large thickness of the P$^+$ region 7c, the red (R) wavelength light absorbed in the P$^+$ region 7c does not contribute to the generation of signal charges. As is apparent by reference to FIG. 8B, the degree of light absorption is high for an upper portion of the island-shaped semiconductor H3. Thus, it is a challenge to reduce sensitivity due to the light absorption at the red (R) wavelength. In contrast, this embodiment can moderate such a reduction in sensitivity.

In the embodiments described above, the pixel arrangement is changed by changing the arrangement of the P$^+$ regions 7a, 7b, and 7c having different thicknesses on the top layers of the upper ends of the island-shaped semiconductors H11 to H33, thereby applying the arrangement of color pixels of primary colors or complementary colors to a stripe arrangement or a staggered arrangement such as a Bayer arrangement. However, even if the island-shaped semiconductors are arranged in a zigzag or staggered manner, each of the island-shaped semiconductors can be made to function as a pixel for a certain color signal by signal processing.

In the first embodiment illustrated in FIG. 1A, the P regions 3a, 3b, and 3c are P regions. Alternatively, the P regions 3a, 3b, and 3c may be intrinsic semiconductor regions that form diodes together with the N regions 6a, 6b, and 6c. This configuration can also be applied to the other embodiments of the present invention.

Furthermore, the substrate 1 in FIG. 1A may be an insulating layer or a semiconductor layer as long as pixels formed in the island-shaped semiconductors H1, H2, and H3 can perform a certain imaging operation.

In the first embodiment illustrated in FIG. 1A, the N$^+$ regions 2a, 2b, and 2c located below the island-shaped semiconductors H1, H2, and H3 are used as signal lines, and the conductive layer 8 that is adjoined to the P$^+$ regions 7a, 7b, and 7c located above the island-shaped semiconductors H1, H2, and H3 are used as pixel selection lines. However, the N$^+$ regions 2a, 2b, and 2c below the island-shaped semiconductors H1, H2, and H3 may be used as pixel selection lines, and the conductive layer 8 that is adjoined to the P$^+$ regions 7a, 7b, and 7c above the island-shaped semiconductors H1, H2, and H3 may be used as signal lines. In this case, in the plan view illustrated in FIG. 1B, the conductive layers 8a, 8b, and 8c are formed in the longitudinal direction in the drawing, and the N$^+$ regions 2a, 2b, and 2c are formed in the horizontal direction in the drawing. This configuration can also be applied to the other embodiments of the present invention.

Furthermore, referring to FIG. 1A, there are illustrated the signal line N$^+$ regions 2a, 2b, and 2c, the island-shaped semiconductor P regions 3a, 3b, and 3c, the diode N regions 6a, 6b, and 6c, and the P$^+$ regions 7a, 7b, and 7c. This is not to be taken in a limiting sense, and the configuration of signal line P$^+$ regions 2a, 2b, and 2c, diode P regions 6a, 6b, and 6c, and N$^+$ regions 7a, 7b, and 7c may be used. This configuration can also be applied to the other embodiments of the present invention.

The pixel selection line conductive layer 8 may be implemented using, in addition to a metal material layer, a transparent (indium tin oxide) layer. In this case, the pixel selection line conductive layer may be formed so as to cover surfaces of P$^+$ regions.

A variety of embodiments and modifications can be made to the foregoing embodiments without departing from the broad spirit and scope of the present invention. The foregoing embodiments are intended to give an example of the present invention, and are not intended to limit the scope of the present invention.

The present invention can be widely applied to solid-state imaging devices for color imaging in which a pixel is formed using an island-shaped semiconductor.

What is claimed is:

1. A solid-state imaging device including a plurality of pixels which are formed of island-shaped semiconductors, the plurality of pixels being two-dimensionally arranged in a pixel region, comprising:
   first semiconductor regions formed on a substrate;
   base semiconductor regions formed on the first semiconductor regions, the base semiconductor regions forming the island-shaped semiconductors;
   second semiconductor regions formed on outer peripheries of the base semiconductor regions which are spaced away from the first semiconductor regions, the second semiconductor regions forming diodes together with the base semiconductor regions; and
   third semiconductor regions formed above the second semiconductor regions so as to adjoin the base semiconductor regions, the third semiconductor regions having a conductivity type opposite to a conductivity type of the second semiconductor regions, wherein
   the third semiconductor region includes a sufficient quantity of acceptor or donor impurities that signal charges generated by absorption of incident light incident on top surfaces of upper ends of the island-shaped semiconductors in the third semiconductor regions are recombined and disappear in the third semiconductor regions,
   the island-shaped semiconductors are formed to include the third semiconductor regions having at least two different thicknesses,
   in the island-shaped semiconductors, a color filter of a primary color or a complementary color is formed over the third semiconductor region of a first island-shaped semiconductor including the third semiconductor region having the smallest thickness or a second island-shaped semiconductor including the third semiconductor region having the second smallest thickness, and light transmitted through the color filter includes a light wavelength component which undergoes light absorption and accumulation of signal charges in the diode region in the first island-shaped semiconductor or second island-shaped semiconductor located below the color filter, and the solid-state imaging device performs an imaging operation which includes a photoelectric conversion operation for absorbing light incident on the top surfaces of the upper ends of the island-shaped semiconductors, in diode regions formed by the second semiconductor regions and the base semiconductor regions, and generating signal charges, a signal charge accumulating operation for accumulating the generated signal charges in the diode regions, an accumulated signal charge quantity read operation for sensing the quantity of signal charges accumulated in the diode regions by detecting a source-drain current flowing through junction field-effect transistors, the junction field-effect transistors having sources or drains which are defined by the first semiconductor regions or the third semiconductor regions, gates which are defined by the second semiconductor regions, and channels which are defined by the base semiconductor regions surrounded by the second semiconductor regions, and a signal charge discharging operation for discharging the signal charges accumulated in the diode regions to the first semiconductor regions.

2. The solid-state imaging device according to claim 1, wherein the first island-shaped semiconductor has the third semiconductor region that transmits blue wavelength light, green wavelength light, and red wavelength light which are incident on the top surfaces of the upper ends of the island-shaped semiconductors, the second island-shaped semiconductor has the third semiconductor region that absorbs blue wavelength light which is incident on the top surfaces of the upper ends of the island-shaped semiconductors, the island-shaped semiconductors further include a third island-shaped semiconductor having the third semiconductor region that absorbs blue wavelength light and green wavelength light which are incident on the top surfaces of the upper ends of the island-shaped semiconductors, the first island-shaped semiconductor, the second island-shaped semiconductor, and the third island-shaped semiconductor are formed so that in the diode region in the first island-shaped semiconductor, photoelectric conversion is performed on the blue wavelength light, green wavelength light, and red wavelength light which are incident on the top surface of the upper end of the first island-shaped semiconductor, and signal charges obtained by the photoelectric conversion are accumulated, in the diode region in the second island-shaped semiconductor, photoelectric conversion is performed on green wavelength light and red wavelength light which are incident on the top surface of the upper end of the second island-shaped semiconductor, and signal charges obtained by the photoelectric conversion are accumulated, and in the diode region in the third island-shaped semiconductor, photoelectric conversion is performed on red wavelength light which is incident on the top surface of the upper end of the third island-shaped semiconductor, and signal charges obtained by the photoelectric conversion are accumulated, and the first island-shaped semiconductor, the second island-shaped semiconductor, and the third island-shaped semiconductor are formed so that the third semiconductor region of the first island-shaped semiconductor has a thickness less than the third semiconductor region of the second island-shaped semiconductor, and the third semiconductor region of the second island-shaped semiconductor has a thickness less than the third semiconductor region of the third island-shaped semiconductor, and the first island-shaped semiconductor, the second island-shaped semiconductor, and the third island-shaped semiconductor are adjacent to one another.

3. The solid-state imaging device according to claim 2, wherein the color filter of a primary color or a complementary color is further formed on the top of the first island-shaped semiconductor or on the top of the second island-shaped semiconductor, and light transmitted through the color filter includes a light wavelength component which undergoes light absorption and accumulation of signal charges in the diode region in the first island-shaped semiconductor or second island-shaped semiconductor located below the color filter.

4. The solid-state imaging device according to claim 1, wherein the first island-shaped semiconductor having on the top thereof a color filter that transmits blue wavelength light, and the first island-shaped semiconductor not having on the top thereof the color filter that transmits the blue wavelength light are formed in the pixel region, and a white signal current including a blue wavelength light component, a green wavelength light component, and a red wavelength light component is obtained from the first island-shaped semiconductor not having on the top thereof the color filter that transmits the blue wavelength light.

5. The solid-state imaging device according to claim 1, wherein the island-shaped semiconductors include a fourth island-shaped semiconductor having a diode region where photoelectric conversion is performed on blue wavelength light, green wavelength light, and red wavelength light transmitted through the third semiconductor region and signal charges obtained by the photoelectric conversion are accumulated, and a fifth island-shaped semiconductor having a diode region where photoelectric conversion is performed on either or both of green wavelength light and red wavelength light transmitted through the third semiconductor region and signal charges obtained by the photoelectric conversion are accumulated, the third semiconductor region of the fifth island-shaped semiconductor has a thickness greater than or equal to the third semiconductor region of the fourth island-shaped semiconductor, a sixth island-shaped semiconductor having a structure similar to the second semiconductor region and the third semiconductor region in the fourth island-shaped semiconductor and the fifth island-shaped semiconductor is formed in the pixel region, a color filter of a primary color or a complementary color is formed on the top of the sixth island-shaped semiconductor, and the fourth island-shaped semiconductor, the fifth island-shaped semiconductor, and the sixth island-shaped semiconductor are formed adjacent to one another.

6. The solid-state imaging device according to claim 1, wherein the island-shaped semiconductors include a seventh island-shaped semiconductor having a diode region where photoelectric conversion is performed on blue wavelength light, green wavelength light, and red wavelength light transmitted through the third semiconductor region and signal charges obtained by the photoelectric conversion are accumulated, and an eighth island-shaped semiconductor having a diode region where photoelectric conversion is performed on green wavelength light and red wavelength light transmitted through the third semiconductor region and signal charges obtained by the photoelectric conversion are accumulated, the third semiconductor region of the eighth island-shaped semiconductor has a thickness greater than the third semiconductor region of the seventh island-shaped semiconductor, a ninth island-shaped semiconductor having a structure similar to the second semiconductor region and the third semiconductor region in the seventh island-shaped semiconductor and the eighth island-shaped semiconductor is formed in the pixel region, a color filter of a primary color or a complementary color is formed on the top of the ninth island-shaped semiconductor, and the seventh island-shaped semiconductor, the eighth island-shaped semiconductor, and the ninth island-shaped semiconductor are formed adjacent to one another.

7. The solid-state imaging device according to claim 1, wherein an insulating layer that transmits light is formed between the substrate and the first semiconductor regions, and the thickness of the insulating layer is set so that, of light rays incident on the top surfaces of the upper ends of the island-shaped semiconductors, a light ray returning from the insulating layer to the diode regions in the island-shaped semiconductors has more red wavelength component than green wavelength component.

8. The solid-state imaging device according to claim 1, wherein in the pixel region, the island-shaped semiconductors including the third semiconductor regions having at least two different thicknesses are arranged in a zigzag or staggered manner.

* * * * *